US006770323B2

(12) United States Patent
Genzer et al.

(10) Patent No.: US 6,770,323 B2
(45) Date of Patent: *Aug. 3, 2004

(54) METHODS FOR FORMING TUNABLE MOLECULAR GRADIENTS ON SUBSTRATES

(75) Inventors: Jan Genzer, Raleigh, NC (US); Kirill Efimenko, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 145 days.

This patent is subject to a terminal disclaimer.

(21) Appl. No.: 10/146,469

(22) Filed: May 15, 2002

(65) Prior Publication Data

US 2003/0015495 A1 Jan. 23, 2003

Related U.S. Application Data

(60) Provisional application No. 60/291,222, filed on May 16, 2001.

(51) Int. Cl.$^7$ .................... C23C 16/04

(52) U.S. Cl. .................... 427/248.1; 427/255.28; 427/273

(58) Field of Search .................... 427/248.1, 255.28, 427/273

(56) References Cited

U.S. PATENT DOCUMENTS

| | | | | |
|---|---|---|---|---|
| 5,429,839 | A | 7/1995 | Graiver et al. | |
| 5,512,131 | A | 4/1996 | Kumar et al. | |
| 5,661,092 | A | 8/1997 | Koberstein et al. | |
| 5,962,079 | A | 10/1999 | Koberstein et al. | |
| 6,180,049 | B1 | 1/2001 | Jang et al. | 264/401 |
| 6,401,001 | B1 | 6/2002 | Jang et al. | 700/118 |
| 6,423,372 | B1 | 7/2002 | Genzer et al. | 427/250 |
| 6,495,212 | B1 | 12/2002 | Gupta | 427/422 |

OTHER PUBLICATIONS

Alexander; "Adsorption Of Chain Molecules With A Polar Head A Scaling Description," *Journal De Physique* 38:8 983–987 (Aug. 1977).

Andersson et al.; "Microtextured Surfaces: Towards Macrofouling Resistant Coatings," *Biofouling* 14(2):167–178 (1999).

Baln et al., "Rapid motion of liquid drops," Scientific Correspondence, *Nature* 372:414–415 (1994).

Bhat et al., "Fabrication Planar Nanoparticle Assemblies with Number Density Gradients," *Langmuir* Letters, A–D (Apr. 2002), no page numbers.

Biesalski et al.; "Preparation And Characterization Of A Polyelectrolyte Monolayer Covalently Attached To A Planar Solid Surface," *Macromolecules* 32:7 2309–2316 (1999).

Bowden et al.; "Spontaneous Formation Of Ordered Structures In Thin Films Of Metals Supported On An Elastomeric Polymer," *Nature* 393:146–149 (May 1998).

Brochard, "Motions of Droplets on Solid Surfaces Induced by Chemical or Thermal Gradients," *Langmuir* 5:432–438 (1989).

Chaudhury et al.; "How to Make Water Run Uphill," *Science* 256:1539–1541 (Jun. 1992).

Chaudhury et al.; "Correlation Between Surface Free Energy And Surface Constitution," *Science* 255:1230–1232 (Mar. 1992).

Chaudhury; "Self–Assembled Monolayers On Polymer Surfaces," *Biosensor & Bioelectronics* 10:785–788 (1995).

Chaudhury; "Interfacial Interaciton Between Low–Energy Surfaces," *Materials Science and Engineering* R16:97–159 (1996).

Chaudbury; "Adhesion And Friction Of Self–Assembled Organic Monolayers," *Curent Opinion in Colloid & Interface Science* 2:65–69 (1997).

Chidsey et al.; "Chemical Functionality In Self–Assembled Monolayers: Structural And Electrochemical Properties," *Langmuir* 6:3 682–691 (1990).

Ciampi et al., "Lateral Transport of Water during Drying of Alkyd Emulsions," *Langmuir* 16:1057–1065 (2000).

Daniel et al., "Fast Drop Movements Resulting from the Phase Change on a Gradient Surface," *Science* 291:633–636 (2001).

de Gennes; "Scaling Theory Of Polymer Adsorption," *Journal De Physics* 37:12 1445–1452 (Dec. 1976).

de Gennes; "Conformations Of Polymers Attached To An Interface," *Macromolecules* 13:5 1069–1075 (Sep.–Oct. 1980).

Elwing et al., "Adsorption of Fibrinogen as a Measure of the Distribution of Methyl Groups on Silicon Surfaces," Notes, *Journal of Colloid and Interface Science* 123:306–308 (1988).

Elwing et al., "Protein and Detergent Interaction Phenomena on Solid Surfaces with Gradients in Chemical Composition," *Advances in Colloid and Interface Science* 32:317–339 (1990).

Ejaz et al.; "Controlled Graft Polymerization Of Methyl Methacrylate On Silicon Substrate By The Combined Use Of The Langmuir–Blodgett And Atom Transfer Radical Polymerization Techniques," *Macromolecules* 31:17 5934–5936 (1998).

Fischer et al.; "Functional Group Orientation In Surface And Bulk Polystyrene Studied By Ultra Soft X–Ray Absorption Spectroscopy," *Applied Surface Science* 133:58–64 (1998).

(List continued on next page.)

*Primary Examiner*—Bret Chen
(74) *Attorney, Agent, or Firm*—Myers Bigel Sibley & Sajovec

(57) ABSTRACT

A method for forming a chemically patterned surface includes subjecting a surface of a substrate to a fluid including a component such that the component reacts with the surface to form a first distribution of the component on the surface. Thereafter, the surface is deformed along at least one axis such that the first distribution of the component is converted to a second distribution different from the first distribution. The second distribution is a gradient of the component.

82 Claims, 15 Drawing Sheets

OTHER PUBLICATIONS

Fujiki et al.; "Radical Grafting From Glass Fiber Surface: Graft Polymerization Of Vinyl Monomers Initiated By Azo Groups Introduced Onto The Surface," *Journal of Polymer Science: Part A: Polymer Chemistry* 37:2121–2128 (1999).
Gaboury et al.; "Microwave Plasma Reactions Of Solid Monomers With Silicon Elastomer Surfaces: A Spectroscopic Study," *Langmuir* 9:11 3225–3233 (1993).
Genzer et al.; "Temperature Dependence Of Molecular Orientation On The Surfaces Of Semifluorinated Polymer Thin Films," *Langmuir* 16:4 1993–1997 (2000).
Genzer et al.; "The Orientation Of Semifluorinated Alkanes Attached To Polymers At The Surface Of Polymer Films," *Macromolecules* 33:5 1882–1887 (2000).
Genzer et al.; "Creating Long–Lived Superhydrophobic Polymer Surfaces Through Mechanically Assembled Monolayers," *Science* 290:2130–2133 (Dec. 2000).
Grunze, "Driven Liquids," *Science* 283:41–42 (1999).
Halpern et al., "Tethered Chains in Polymer Microstructures," *Advances in Polymer Science* 100:31–71 (1992).
Hillborg et al.; "Hydrophobicity Changes In Silicon Rubbers," *IEEE Transactions or Dielectrics and Electrical Insulation* 6:5 703–717 (Oct. 1999).
Huang et al.; "Surface–Confined Living Radical Polymerization For Coatings In Capillary Electrophoresis," *Anal. Chem.* 70:19 4023–4029 (Oct. 1998).
Huang et al.; "Make Ultrathin Films Using Surface–Confined Living Radical Polymerization," *Chemtech* 19–25 (Dec. 1998).
Huang et al.; "Surface Initiation Of Living Radical Polymerization For Growth Of Tethered Chains Of Low Polydispersity," *Macromolecules* 32:5 1694–1696 (1999).
Huck et al.; "Ordering Of Spontaneously Formed Buckles On Planar Surfaces," *Langmuir*16:7 3497–3501 (2000).
Husseman et al.; "Controlled Synthesis Of Polymer Brushes by "Living" Free Radical Polymerization Techniques," *Macromolecules* 32:5 1424–1431 (1999).
Ichimura et al., "Light–Driven Motion of Liquids on a Photoresponsive Surface," *Science* 288:1624–1626 (2000).
Johnston et al.; "Networks From α,ω–Dihydroxypoly(Dimethylsiloxane) And (Tridecafluro–1,1,2,2–Tetrahydrooctyl) Triethoxysilane: Surface Microstructures And Surface Characterization," *Macromolecules* 32:24 8173–8182 (1999).
Kennan et al.; "Effect Of Saline Exposure On The Surface And Bulk Properties Of Medical Grade Silicone Elastomers," *J Biomed Mater Res* 36:487–497 (1997).
Lee et al., "Characterization of Wettability Gradient Surfaces Prepared by Corona Discharge Treatment," *Journal of Colloid and Interface Science* 151:563–570 (1992).
Lestelius et al., "Order/disorder gradients of n–alkanethiols on gold," *Colloids and Surfaces B: Biointerfaces* 15:57–70 (1999).
Liedberg et al., "Molecular Gradients of ω–Substituted Alkanethiols on Gold Studied by X–ray Photoelectron Spectroscopy," *Langmuir* 13:5329–5334 (1997).
Leidberg et al., "Molecular Gradients of ω–Substituted Alkanethiols on Gold: Preparation and Characterization," *Langmuir* 11:3821–3827 (1995).
Luzinov et al.; "Synthesis And Behavior Of The Polymer Covering On A Solid Surface. 3. Morphology And Mechanism Of Formation Of Grafted Polystyrene Layers On The Glass Surface," *Macromolecules* 31:12 3945–3952 (1998).
Meredith et al., "Combinatorial Methods for Investigations in Polymer Materials Science," MRS Bulletin, Apr., 330–335 (2002).
Milner, "Polymer Brushes," *Science* 251:905–914 (Feb. 1991).
Minko et al., "Radical Polymerization Initiated From A Solid Substrate 1. Theoretical Background," *Macromolecules* 32:14 4525–4531 (1999).
Minko et al.; "Radical Polymerization Initiated From A Solid Substrate. 2. Study Of The Grafting Layer Growth On The Silica Surface By In Situ Ellipsometry," *Macromolecules* 32:14 4532–4538 (1999).
Onyang et al.; "Convention Of Some Siloxana Polymers To Silicon Oxide By UV/Ozone Photochemical Processes," *Chem. Mater.* 12:6 1591–1596 (2000).
Patten et al.; "Polymers With Very Low Polydispersities From Atom Transfer Radical Polymerization," *Science* 272:866–868 (May 1996).
Patten et al.; "Atom Transfer Radical Polymerization And The Synthesis Of Polymeric Materials," *Adv. Mater.* 10:12 901–915 (1998).
Pitt, William G., "Fabrication of a Continuous Wettability Gradient by Radio Frequency Plasma Discharge," *Journal of Colloid and Interface Science* 133:223–227 (1989).
Prucker et al.; "Synthesis Of Poly(styrene) Monolayers Attached To High Surface Area Silica Gels Through Self–Assembled Monolayers Of Azo Initiators," *Macromolecules* 31:3 592–601 (1998).
Prucker et al.; "Polymer Layers Through Self–Assembled Monolayers Of Initiators," *Langmuir* 14:24 6893–6898 (1998).
Ruardy et al., "Preparation and characterization of chemical gradient surfaces and their application for the study of cellular interaction phenomena," *Surface Science Reports* 29:1–30 (1997).
Sandre, et al., "Moving droplets on asymmetrically structured surfaces," The American Physical Society, Physical Review E, 60: 2964–2971 (Sep. 1999).
Shah et al.; "Using Atom Transfer Radical Polymerization To Amplify Monolayers Of Initiators Patterned By Microcontact Printing Into Polymer Brushes For Pattern Transfer," *Macromolecules* 33:2 597–605 (2000).
Silver et al.; "Surface Properties And Hemocompatibility Of Alkyl–Siloxane Monolayers Supported On Silicon Rubber: Effect Of Alkyl Chain Length And Ionic Functionality," *Biomaterials* 20: 1533–1543 (1999).
Stöhr et al.; "Monolayers Of Amphiphilic Block Copolymers Via Physisorbed Macroinitiators," *Macromolecules* 33:12 4501–4511 (2000).
Suzuki, "New Concept of a Hydrophobicity Motor Based on Local Hydrophobicity Transition of Functional Polymer Substrate for Micro/Nano Machines," *Polymer Gels and Networks* 2:279–287 (1994).
Swalen et al.; "Molecular Monolayers and Films," *Langmuir* 3:6 932–950 (1987).
Tsubokawa et al.; "Effect Of Polymerization Conditions On The Molecular Weight Of Polystyrene Grafted Onto Silic In The Radical Graft Polymerization Initiated By Azo Or Peroxyester Groups Introduced Onto The Surface," *Colloid & Polymer Science* 273:11 1049–1054 (1995).
Tsubokawa et al.; "Surface Grafting Of Polymers Onto Glass Plate: Polymerization Of Vinyl Monomers Initiated By Initiating Groups Introduced Onto The Surface," *J Appl Polym Sci* 65:2165–2172 (1997).

Urquhart et al.; "Core Excitation Spectroscopy Of Phenyl– And Methyl–Substituted Silanol, Disiloxane, And Disilane Compounds; Evidence For π–Delocalization Across The Si–$C_{phenyl}$ Bond," *Organometallics* 16:10 2080–2088 (1997).

Velten et al.; "Polymerization Of Styrene With Peroxide Initiator Ionically Bound To High Surface Area Mica," *Macromolecules* 32:11 3590–3597 (1999).

von Werne et al.; "Preparation of Stucturally Well–Defined Polymer–Nanoparticle Hybrids With Controlled/Living Radical Polymerizations," *J. Am. Chem. Soc.* 121:32 7409–7410 (1999).

Wang et al.; "Liquid Crystalline, Semifluorinated Side Group Block Copolymers With Stable Low Energy Surfaces: Synthesis, Liquid Crystalline Structure, And Critical Surface Tension," *Macromolecules* 30:7 1906–1914 (1997).

Wasserman et al.; "Structure And Reactivity Of Alkylsiloxane Monolayers Formed By Reaction Of Alkyltrichlorosilanes On Silicon Substrates," *Langmuir* 5:4 1074–1087 (1989).

Welin–Klinström et al., "Comparison between wettability gradients made on gold and on Si/$SiO_2$ substrates," *Collids and Surfaces B: Biointerfaces* 15:81–87 (1999).

Xia et al., "Extending Microcontact Printing as a Microlithographic Technique," *Langmuir* 13 2059–2067 (1997).

Yamamoto et al.; "Surface Interaction Forces Of Well–Defined, High–Density Polymer Brushes Studied By Atomic Force Microscopy. 1. Effect Of Chain Length, " *Macromolecules* 33:15 5602–5607 (2000).

Zaremski et al., "The Mechanism of Graft Free–Radical Polymerization on Silica Surface Containing Iniferter Groups," *Molecular Reports* A33 (Suppls. 3&4) 237–242 (1996).

Zhao et al.; "Synthesis Of Tethered Polystyrene–block–Poly(methyl methacrylate) Monolayer On A Silicate Substrate By Sequential Carbocationic Polymerization And Atom Transfer Radical Polymerization," *J. Am. Chem. Soc.* 121:14 3557–3558 (1999).

METHODS FOR FORMING TUNABLE MOLECULAR GRADIENTS ON SUBSTRATES

RELATED APPLICATIONS

This application claims priority from U.S. Provisional Patent Application Serial No. 60/291,222, filed May 16, 2001, the disclosure of which is hereby incorporated herein by reference in its entirety.

FIELD OF THE INVENTION

The invention generally relates to methods for modifying the surfaces of substrates and, more particularly to methods for forming molecular gradients on substrates.

BACKGROUND OF THE INVENTION

The deposition of self-assembled monolayers (SAMs) made of either mercapto-terminated molecules attached to gold (or other noble metals) or chlorosilane- (or alkoxysilane-) terminated moieties anchored to hydroxyl-terminated substrates offers one of the highest quality routes for systematically and reproducibly tuning the surface properties of materials. By controlling the chemical composition of the terminal group, the length, and microstructure of the SAM molecule, the chemical and physical properties, including wetting, adhesion, friction, and biosensing, can be successfully tailored. While early studies concentrated mainly on preparing substrates with laterally homogeneous SAMs, recent advances in the field allow for creating SAMs with two-dimensional chemical patterns. See Xia, *Chem. Rev.* 99, 1823–1848 (1999). In particular, the microcontact printing ($\mu$CP) technique has proven to be a convenient method for preparing chemically patterned substrates.

While $\mu$CP is useful for decorating materials substrates with a variety of motif shapes and dimensions, it typically produces sharp boundaries between the distinct chemical substrate regions. However, for some applications, it is desirable or required that the wetting properties of the substrate change gradually over a certain region in space. This situation can be accomplished by producing surfaces with a gradually varying chemistry along their length. In these so-called gradient surfaces, the gradient in surface energy is responsible for a position-bound variation in physical properties, most notably the wettability. For example, gradient surfaces can be particularly useful in studying interactions in biological systems, as the influence of the entire wettability spectrum upon protein adsorption or cellular interactions can be obtained in one single experiment. While methods to prepare such gradient substrates have been described previously, none of the currently used techniques are believed to provide a complete control over all gradient parameters, including, in one example, the wettability of the two opposite gradient sides and the steepness of the gradient region in between.

Conventional techniques are known for preparing surfaces whose surface energies vary gradually over a certain distance. These techniques are typically rather cumbersome and involve various "wet chemistry" surface treatments, which is often times hard to control and not applicable to all materials. For practical application, it is thus desirable to develop methods that would both eliminate the "wet chemistry" environment and produce surfaces with reproducible and tunable surface properties. Chaudhury and Whitesides showed that these limitations could be overcome by creating chemical gradients by vapor deposition. See Chaudhury and Whitesides, *Science*, 256, 1539–1541 (1992). In their experiment, a container with chlorosilane-based molecules (R—$SiCl_3$) mixed with paraffin oil is placed on one side of a silicon wafer. By varying the relative amounts of R—$SiCl_3$ and the paraffin oil, the concentration of R—$SiCl_3$ can be conveniently adjusted. Sufficiently short molecules (up to ca. R=—$(CH_2)_{14}H$) have high enough vapor pressure so that they evaporate even at a room temperature. As the chlorosilane evaporates, it diffuses in the vapor phase and generates a concentration gradient along the substrate. Upon impinging on the substrate, the R—$SiCl_3$ molecules react with the substrate —OH functionalities and form an organized SAM. According to this reference, the kinetics of the whole process is controlled predominantly by the vapor diffusion of R—$SiCl_3$, so that the vapor gradient gets imprinted onto the silica substrate.

SUMMARY OF THE INVENTION

According to method embodiments of the present invention, a method for forming a chemically patterned surface includes subjecting a surface of a substrate to a fluid including a component such that the component reacts with the surface to form a first distribution of the component on the surface. Thereafter, the surface is deformed along at least one axis such that the first distribution of the component is converted to a second distribution different from the first distribution. The second distribution is a gradient of the component.

According to further method embodiments of the present invention, a method for forming a patterned surface includes enlarging a substrate having an initial surface portion to form an enlarged surface portion from the initial surface portion. A functional group is then conjugated on the enlarged surface portion. The substrate is then reduced to form a reduced surface portion from the enlarged surface portion, with the reduced surface portion having an area less than the enlarged surface portion, and with the reduced surface portion having the functional group deposited therein at a greater density than the enlarged surface portion. The functional group in the enlarged surface portion forms a density gradient.

According to further method embodiments of the present invention, a method for forming a chemically patterned surface includes subjecting a surface of a substrate to a vapor including a first component such that the first component reacts with the surface to form a first distribution of the first component on the surface. The first distribution is a gradient of the first component. The surface of the substrate is subjected to a fluid including a second component such that the second component reacts with the surface to form a second distribution of the second component on the surface. The second distribution is a gradient of the second component. The gradients of the first and second distributions extend in different directions.

According to further method embodiments of the present invention, a method for forming a chemically patterned surface includes providing a mask on a surface of a substrate to form at least one exposed portion of the surface not covered by the mask and at least one covered portion of the surface covered by the mask. The surface is subjected to a fluid including a component such that the component reacts with the at least one exposed portion and is prevented from reacting with the at least one covered portion by the mask. The component reacted with the at least one exposed portion forms a distribution of the component on the surface, the distribution being a gradient.

Objects of the present invention will be appreciated by those of ordinary skill in the art from a reading of the figures and the detailed description of the preferred embodiments which follow, such description being merely illustrative of the present invention.

DETAILED DESCRIPTION OF THE PREFERRED EMBODIMENTS

Figure 1:
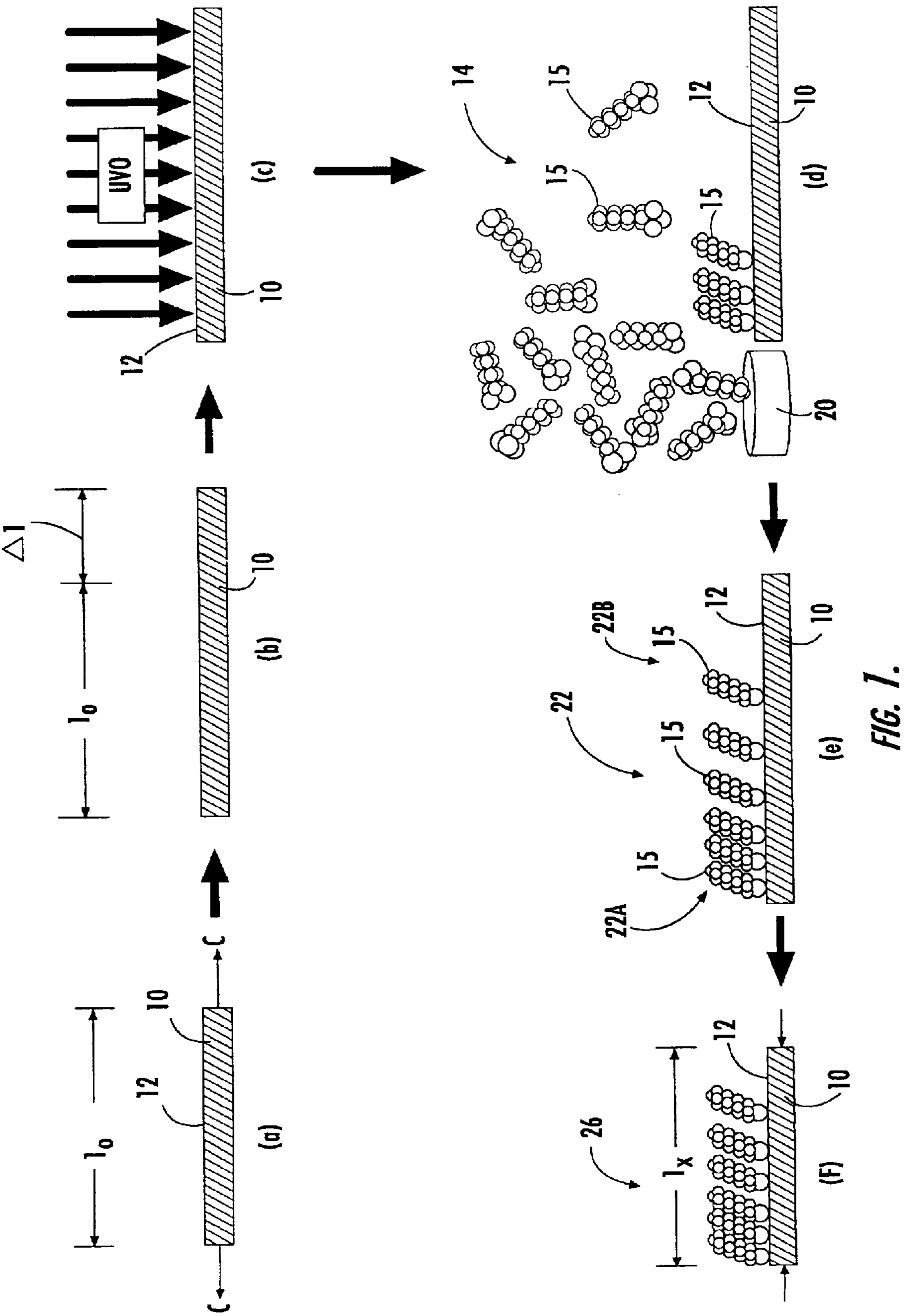
FIGS. 1(*a*)–(*f*) are schematic diagrams illustrating a method for forming a chemically patterned substrate according to embodiments of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

The term "gradient" as used herein means a characteristic or property having a profile that gradually and substantially monotonously changes as a function of spatial position. The characteristic or property is position bound or dependent and substantially continuously varies with position. The term "chemical gradient" or "molecular gradient" as used herein means a gradually and substantially monotonously changing chemistry along an associated dimension or axis which is responsible for a position bound variation in physical properties, such as wettability.

According to embodiments of the present invention, a method for forming a chemical pattern on a surface of a substrate includes: a) subjecting the surface of the substrate to a fluid including a component such that the component reacts with the surface to form a first distribution of the component on the surface; and thereafter b) deforming the surface along at least one axis such that the first distribution of the component is converted to a second distribution different from the first distribution; c) wherein the second distribution is a chemical or molecular gradient of the component. Methods according to the present invention may be used to form tunable molecular gradients.

As discussed in more detail below, the step of deforming the surface may include, for example, elongation or reduction (e.g., contraction or compression) along the selected axis or axes. The step of deforming may be accomplished using, for example, mechanical, chemical, thermal and/or electrical means. Various means and methods for deforming the surface are discussed below.

According to preferred methods, the surface is also deformed prior to the step of subjecting the surface to the fluid. For example, the surface may be stretched along the selected axis or axes, subjected to the fluid, and thereafter allowed or caused to partially or fully return to its pre-stretched condition, such return constituting the above-mentioned step of deforming along the at least one axis. By way of further example, the surface may be deformed by swelling using a suitable swelling agent, subjected to the fluid, and thereafter allowed or caused to partially or fully de-swell to its pre-swelled dimension, such de-swelling constituting the above-mentioned step of deforming along the at least one position.

The step of subjecting the surface to the fluid may include exposing the surface to a liquid bath or a gas (e.g., a vapor) including the component. Such exposure may be uniform (i e., homogeneous) or non-uniform. In particular, the fluid may be introduced to the surface with a fluid concentration gradient so that the first distribution is a corresponding (and preferably proportional) gradient of the component.

The foregoing and further embodiments of the present invention will be described in greater detail hereinafter.

With reference to FIGS. 1(*a*)–(*f*), a method according to embodiments of the present invention includes the following steps for forming a chemical gradient on a substrate. A substrate 10 as shown in FIG. 1(*a*) is provided having a target surface 12 on which a gradient monolayer is desired. According to some embodiments, the substrate 10 is preferably a film (i.e., has a thickness of no more than 1 mm).

The substrate 10 (including the surface 12) is formed of a material having a selected elasticity. The elastic substrate of the invention may be formed from any suitable material. In general, it is desirable that the material is capable of being physically or chemically forced to reversibly (or partially reversibly) increase its surface area. By way of example, the substrate may be formed from a network of polymers (e.g., homopolymers, copolymers, and the like). Exemplary materials include, without limitation, siloxanes (e.g., poly (dimethylsiloxane) (PDMS), poly(hydromethylsiloxane)), and other rubbery networks such as natural rubber, synthetic rubber, butadienes, and the like, as well as composites or combinations thereof. In various preferred embodiments, the substrate is prepared by crosslinking the polymer and curing the crosslinked network to form a thermoset material. The crosslinking and curing may be carried out using techniques known to one skilled in the art.

The substrate 10 is mechanically stretched or elongated a distance Δ1 along a selected axis C—C from the relaxed condition as shown in FIG. 1(*a*) to a selected relative strain Δx as shown in FIG. 1(*b*). Preferably, the relative strain Ax is no more than 200 percent of the initial length $l_o$ (FIG. 1). According to certain embodiments, the relative strain Δx is typically between about 1 and 100 percent of the initial length. The substrate may be elongated along multiple dimensions or axes (e.g., biaxially elongated). Any suitable technique and apparatus may be used to elongate the substrate, for example, as disclosed in U.S. patent application Ser. No. 09/736,675 (filed Dec. 13, 2000; inventors Genzer et al.), titled *Tailoring the Grafting Density of Organic Modifiers at Solid/Liquid Interfaces*, now U.S. Pat. No. 6,423,372 (issued Jun. 23, 2002), the disclosure of which is hereby incorporated herein by reference in its entirety.

In certain embodiments, the portion of the surface 12 to be patterned is uniformly elongated along the selected axis. Preferably, the substrate is stretched in a manner that increases the overall area of the surface 12.

The elongated surface 12 may then be treated to impart hydrophilicity thereto. For example, as shown in FIG. 1(*c*) the treatment step may include exposing the elongated surface to an ozone treatment to form a reactive group on the enlarged surface portion. Preferably, the ozone treatment is used in conjunction with an ultraviolet treatment (i.e., an ultraviolet/ozone (UVO) treatment). Ozone-treatment techniques are known in the art, and are described, for example, in U.S. Pat. No. 5,661,092 to Koberstein et al. and U.S. Pat. No. 5,962,079 to Koberstein et al., the disclosures of which are incorporated herein by reference in their entirety. Alternatively, surface hydrophilic groups may be created by treating the surface with ceric ammonium nitrate as disclosed in U.S. Pat. No. 5,429,839 to Graiver et al., the disclosure of which is incorporated herein by reference. As a further alternative, surface hydrophilic groups may be created using networks formed by cross-linking poly(methyl hydrosiloxanes) (PMHS) with vinyl-terminated PDMS, as described by the following reaction schemes (scheme 1) and (scheme 2):

(scheme 1)

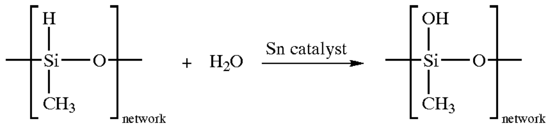

(scheme 2)

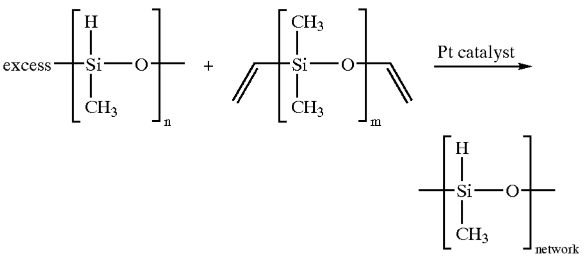

When an excess of PMHS is used, not all ≡Si—H groups in the PMHS are cross-linked during the network formation. Those ≡Si—H groups that reside on the sample surface can later be hydrolyzed to produce the surface ≡Si—OH moieties.

The reactive group that results on the substrate surface is preferably one or more of a hydroxyl group, a carboxyl group, and a peroxide group.

Thereafter, the elongated surface 12 is subjected to a fluid 14 including the component 15 to be patterned as a gradient on the surface. The component 15 is preferably a functional group capable of conjugating or reacting with the surface (which may include reactive groups as discussed above). The fluid may be a liquid or a gas (e.g., a vapor). A wide variety of components or functional groups may be employed in the subjecting step.

The surface is subjected to the fluid such that the fluid delivers a concentration gradient of the component along the surface 12, as discussed in more detail below. The concentration gradient impinging on the surface extends generally along the axis C—C of elongation of the elongated surface.

Preferably, the subjecting step includes depositing a functional group on the elongated surface such that the functional group reacts or conjugates with the reactive group to chemically modify the reactive group, i. e., a chain is formed on the substrate. In general, the chain may be in the form of a monomer, oligomer, or polymer (e.g., homopolymer, copolymer, terpolymer, etc.). These chains may be present in the form of a monolayer, although other configurations may be formed. In such embodiments, the invention provides for the fabrication of mechanically assembled monolayers (hereinafter "MAMs"). In embodiments in which polymers are assembled on the substrate, the fabrication is referred to as mechanically assisted polymer assembly.

In preferred embodiments, the functional group may be any chemical group (e.g., a Cl-group such as 1-trichlorosilyl-2-(m-p-chloromethyl-phenyl)ethane), HS—, M—, and combinations thereof. M is preferably represented as $F(CF_2)_{y1}(CH_2)_{x1}$. In these groups, x1 and y1 are individually selected and each preferably ranges from 1 to 8, 25, 50, 100, or a 1000 including all values therebetween. Most preferably, x1 is 2 and y1 most preferably ranges from 6 to 8. M which contains fluorine-based molecules may also encompass other materials such as those described in U.S. Pat. No. 5,863,612 to DeSimone, the disclosure of which is incorporated herein by reference in its entirety. Such fluorinated materials include, without limitation, fluoroacrylates, fluoroolefins, fluorostyrenes, fluoroalkylene oxides, fluorinated vinyl alkyl ethers, and combinations thereof. In addition, M can be any other chemical functionality of the following formula including, without limitation, ω-R—, where ω is a functional terminus, such as $—CH_3$, $—CF_3$, $—NH_2$, —COOH, —SH, $—CH{=}CH_2$, and others, and wherein R is a hydrocarbon chain which may be branched or unbranched and/or substituted or unsubstituted. The hydrocarbon chain preferably has 1 to 100,000 repeating units, and encompasses all values therebetween.

Not intending to be bound by theory, it is believed that the formation of certain embodiments of functional groups may be illustrated by the following reaction schemes (3) and (4):

Reaction Scheme (3)

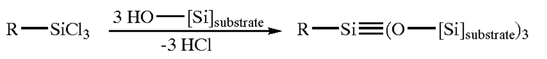

wherein R is defined above.

Reaction Scheme (4)

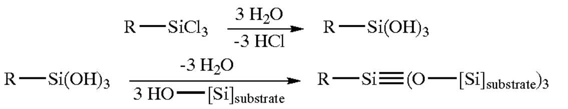

wherein R is defined above.

While Reaction Scheme (4) illustrates use of $R—SiCl_3$, it is to be understood that $R—SiCl_2R'$ or $R—SiClR'_2$, wherein R' is alkyl, preferably lower alkyl, and more preferably methyl or ethyl, could be used, with the product of the condensation reaction being $R—Si(R')(O—[Si]_{substrate})_2$ or $R—Si(R')_2(O—[Si]_{substrate})$, respectively. Although Reaction Scheme (4) illustrates use of $R—SiCl_3$, it is to be understood that compounds such as $R—Si(OR")_3$, $R—Si(OR")_2R'$, or $R—Si(OR")(R')_2$ can be used, wherein R' and R" are independently alkyl, preferably lower alkyl, and more preferably methyl or ethyl. As will be understood by those skilled in the art, the compounds will undergo a condensation reaction, in which the alcohol, R"OH, is eliminated, with the product of the condensation reaction being $R—Si(O—[Si]_{substrate})_3$, $R—Si(R')(O—[Si]_{substrate})_2$, or $R—Si(R')_2(O—[Si]_{substrate})$, respectively.

The chain may be formed by growing the functional group, which has been deposited on the substrate, or as described herein, by grafting the functional group onto the substrate and using it as an initiator for polymerization (so called "grafting from"). The group M referred to above may serve as a polymerization free radical or controlled radical initiator and the method may comprise grafting the group M onto the substrate to attach the molecules thereto, i.e., form molecular "brushes" on the substrate. The "brushes" may exist in the form of oligomers or polymers.

The brush graft density of molecules at the surface of the substrate may be controlled by varying any of a number of process variables such as, for example, the time of ozone treatment (i.e., $\tau_{UVO}$), initiator deposition time (i.e., $\tau_M$), or initiator concentration (i.e., $C_M$). Various brush graft densities may be obtained for the purposes of the invention. Preferably, the brush graft density ranges from about $10^{14}$ molecules/$cm^2$ to about $10^{15}$ or $10^{16}$ molecules/$cm^2$. In another embodiment, the brush graft density may be no greater than about $10^{16}$ molecules/$cm^2$.

In other embodiments, biological materials may be attached to the surface of the substrate. Accordingly, any number of complementary functional groups may be attached thereto as desired by the skilled artisan such as, for example, oligonucleotides (e.g., DNA, RNA), proteins, peptides, and antibodies. For example, one can tether a polypeptide molecule composed of a defined sequence of amino acids to the substrate. The attachment may be accomplished as set forth generally by embodiments described herein, for example, by anchoring the peptide molecule from the solution or by growing the peptide by the "grafting from" reaction.

In embodiments which employ —SH as the functional group, the surface of the substrate typically comprises at least one metal thereon which is compatible with this group. Preferred metals include, without limitation, gold, silver, platinum, palladium, alloys thereof, and combinations thereof. In general, the functional group may be a monomer, oliogomer, homopolymer, copolymer, and the like.

As discussed above, the surface is subjected to the fluid such that the fluid delivers a concentration gradient of the component extending generally along the direction of elongation of the elongated surface. According to preferred embodiments, this may be accomplished using a technique as described in Chaudhury and Whitesides, *Science*, 256, 1539–1541 (1992), the disclosure of which is incorporated herein by reference, and as described in the Background of the Invention above. A vapor source 20 is provided and is selectively located relative to the surface 12. The vapor source 20 may include the prescribed component and an inert dilutant such as paraffin oil. As the component 15 evaporates and diffuses in the vapor phase, it generates a gradient of concentration that decreases along the axis C—C of the elongation of the surface 12. The profile of this gradient is imprinted onto the surface 12 by reaction therewith. Accordingly, the concentration of the vapor 14 and, hence, the component 15, incident at each portion of the surface 12 is proportional to the distance of said portion from the vapor source 20. Thus, surface portions closer to the vapor source 20 will receive greater deposits of the component and surface portions farther from the vapor source will receive lesser deposits of the component.

In this manner, a first distribution 22 of the component is deposited on and attached to the surface 12. The first distribution 22 is schematically illustrated in FIG. 1(*e*) and typically comprises a substantially two-dimensional array or pattern. Notably, as a result of the vapor deposition technique, the first distribution 22 is a gradient extending progressively and monotonously from a high density end 22A to a low density end 22B.

Following deposition of the component as a gradient on the elongated surface 12, the elongated substrate is released. The surface 12 is thereby allowed to elastically return (i.e., is reduced in length) along the selected axis or axes to a terminal length $l_x$ and area to provide the desired chemically patterned surface 12. The terminal length $l_x$ is less than the elongated length ($l_o+\Delta l$), and the terminal area is preferably less than the area of the elongated surface. The terminal length and area may be the same as the original length $l_o$ and area, that is, prior to the step of stretching. It will be appreciated that in the event the induced elongation extended into the viscoelastic or viscous range for the substrate material, the surface 12 will not return fully to its original length $l_o$. According to some embodiments, it is preferred that the stretching be carried out fully within the region where Hook's law is valid. According to other embodiments, the terminal length $l_x$ is no more than 100 percent greater than the original length $l_o$. More preferably, the terminal length $l_x$ is between about 1 and 100 percent greater than the original length $l_o$.

As the surface 12 transitions from the elongated length ($l_o+\Delta l$) to the terminal length $l_x$, the density of the component attached to the surface 12, at least along the elongation axis C—C, increases proportionally. In this manner, the first distribution 22 of the component on the surface 12 is converted to a modified, denser, second distribution 26 of the attached component on the surface 12. The second distribution 26 is schematically illustrated in FIG. 1(*f*).

Notably, the second distribution 26 is also a density gradient of the component. However, the absolute slope of the density gradient of the second distribution 26 (i.e., the absolute slope of component density as a function of position along the elongation/retraction axis C—C) is greater (i.e., steeper) than the absolute slope of the density gradient of the first distribution 22. That is, the gradient of the second distribution 26 has a steeper concentration profile than that of the first distribution 22.

The molecular density gradient of the component in the second distribution 26 is preferably between about $-10^{12}/cm^2$ and $10^{16}/cm^2$. Preferably, the molecular density gradient of the component in the second distribution 26 is preferably between about $10^{14}/cm^2$ and $10^{15}/cm^2$ percent steeper than the molecular density gradient of the component in the first distribution 22.

The actual slope of the gradient of the second distribution 26 can be tuned or tailored by selection of the differential between the elongated length ($l_o+\Delta l$) and the terminal length $l_x$. Thus, the gradient of the component on the surface 12 is not limited to those that may be achieved simply by controlling the parameters of the deposition process (e.g., exposure time, exposure temperature, vapor source placement relative to the surface, concentration of the component diffusion source, etc.). In particular, gradients with steeper slopes may be achieved.

The aforementioned parameters of the deposition process (or other process for subjecting the elongated surface 12 to a fluid including the component so as to form the first distribution 22) may also be controlled to facilitate tuning of the second distribution 26 gradient. Tuning may be further enhanced by selection of the rate at which the surface 12 is returned to its terminal position. Other means and methods for tuning the second distribution 26 gradient include uniformity of stretching/releasing (uniform v. non-uniform).

The gradient of the second distribution 26 may provide functional gradients of various surface properties including, without limitation, surface energy, surface permeability, water absorption, charge, surface weatherability, surface chemical pattern, surface resistance to liquids of varying pHs (e.g., acids and bases), and surface hardness. By way of example, the gradient on the surface 12 may be provided with certain tuned wettable properties by adjusting, for example, Δx and M (i.e., initiator as defined herein). These wettable properties may be either hydrophilic or hydrophobic. In certain embodiments, the wettable properties of the substrate (after release) may be such that the water contact angle ranges from 20° to 140°. Moreover, by adjusting the strain Δx, the elastic substrate may have certain tuned barrier properties.

The molecular mobility of the surface chains (functional groups) may be controlled by adjusting the rate of strain release. Although not intending to be bound by theory, at small release rates one potentially expects the molecules to have enough time to respond to the mechanical manipulation; at higher release rates chain interlocking ("entanglement") may possibly lead to irregular structures. Additionally, the released elastic substrate may possess long-lasting (non-reconstructive) wetting properties, i.e., the surface energy of the released elastic substrate remains constant for up to or at least six months subsequent to the formation of the substrate.

The surface tension of the released elastic substrate may also be adjusted as deemed appropriate by one skilled in the art. For example, the released elastic substrate may preferably have a surface tension ranging from about 6 or 9 $mJ/m^2$ to about 11 to 13 $mJ/m^2$. In certain embodiments, the substrate may have a critical surface tension of as low as 6 $mJ/m^2$ (e.g., a crystalline array of $—CF_3$ groups). The surface tension of the elastic substrate is believed to vary according to the type of molecule chain(s) attached thereto.

Additionally, the attached component is more densely packed in the second distribution 26 than in the first distribution 22, offering a number of advantages. For example, by "compressing" the gradient of the first distribution 22, the effect of irregularities of the first distribution 22 may be reduced. Other advantages include the ability to tailor molecular orientation, to reduce transport of fluids "through" the gradient, and to minimize surface reorganization of the attached molecules. The density of functional groups reacted to the reacted groups (i.e., molecules) on the released elastic substrate can vary. In one embodiment the density ranges from $10^{14}$ molecules/$cm^2$ to $10^{15}$ or $10^{16}$ molecules/$cm^2$. Preferably, the released elastic substrate contains no greater than $10^{16}$ molecules/$cm^2$. In general, for various embodiments described herein, the groups (i.e., chains) extending from the released elastic substrate 10 are typically aligned so as to be present as a closely packed array.

A further method of the present invention for forming a chemically patterned substrate surface corresponds to the method discussed above with reference to FIGS. 1(*a*)–(*f*) except as follows. Rather than elongating and releasing the surface 12, the deforming step (following the subjecting step) includes compressing the surface 12 such that the distribution prior to the deforming step (i.e., the first distribution) is denser than the distribution following the deforming step (i.e., the second distribution).

Figure 2:
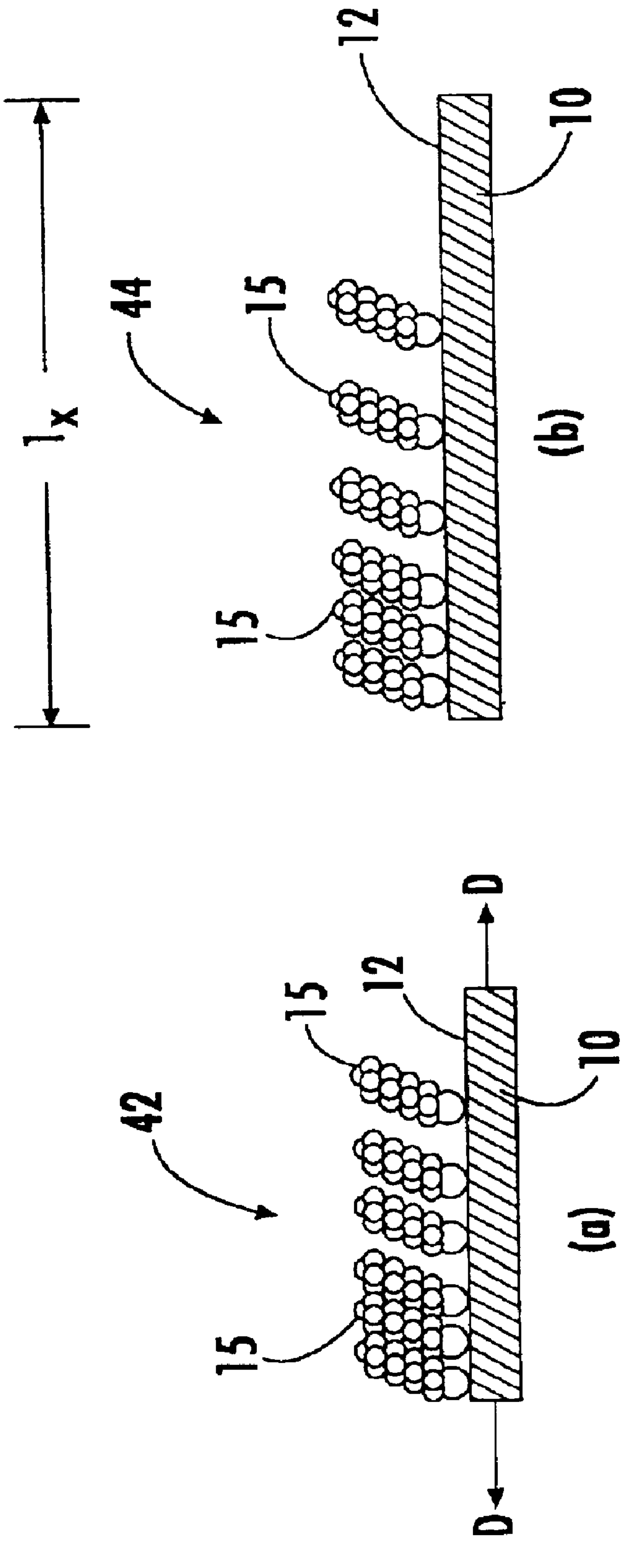
FIGS. 2(*a*) and 2(*b*) are schematic diagrams illustrating a method for forming a chemically patterned substrate according to further embodiments of the present invention.

More particularly and with reference to FIGS. 2(*a*)–(*b*), the substrate 10 is compressed by suitable means along the selected axis D-D to a selected relative strain Δx. Any suitable technique and apparatus may be used to compress the substrate. In certain embodiments, the portion of the surface 12 to be patterned is uniformly compressed along the selected axis. Preferably, the substrate is compressed in a manner that decreases the overall area of the surface. The substrate 10 is shown in its compressed condition in FIG. 1(*a*).

The compressed surface 12 may then be treated to create reactive groups as described above with regard to the method of FIGS. 1(*a*)–(*f*).

The compressed substrate 10 is thereafter subjected, in the same manner as discussed above with reference to FIGS. 1(*a*)–(*f*), to the fluid including the component 15 (e.g., functional group) to form a first distribution 42 on the surface 12 as schematically illustrated in FIG. 2(*a*), the first distribution 42 being a gradient.

Following deposition of the component 15 as a gradient on the compressed surface, the compressed substrate is released. The surface 12 is thereby allowed to elastically return (i.e., expand) along the selected axis D—D to a terminal length $l_x$ and area. The terminal length $l_x$ and area may be the same as or less than the original length and area, that is, the length and area prior to the step of compressing. Preferably, the terminal length $l_x$ is no more than 100 percent greater than the original length. More preferably, the terminal length $l_x$ is between about 1 and 100 percent greater than the original length.

As the surface 12 transitions from the compressed length to the terminal length, the density of the component 15 attached to the surface 12, at least along the compression axis D—D, decreases proportionally. In this manner, the first distribution 42 of the component on the surface is converted to a less dense second distribution 44 of the attached component on the surface. As in the method of FIGS. 1(*a*)–(*f*), the second distribution 44 is also a gradient of the density of the component 15. However, the absolute slope of the density gradient of the second distribution 44 is less than the absolute slope of the density gradient of the first distribution 42. The actual slope of the gradient can be tuned by selection of the differential between the compressed length and the terminal length, as well as by control of the various parameters mentioned above.

While the embodiments described above rely on the elastic response of the elongated or compressed substrate, other means and methods may be used to deform the surface following the step of subjecting the surface to the fluid. For example, the surface carrying the first distribution may be compressed or elongated mechanically (e.g., by applying a mechanical load), thermally (by heating or cooling), or chemically (e.g., by applying a fluid operative to expand or contract the substrate).

Moreover, while the embodiments described above include elongating or compressing the substrate prior to the step of subjecting the surface to the fluid, these steps may also be omitted with suitable provision. For example, the material of the substrate 10 may be selected and the substrate configured or handled such that the surface 12 may be deformed and retain deformation along the selected axis.

The target surface may also be deformed using a swelling agent. For example, a PDMS substrate may be swelled using a suitable swelling agent such as toluene (or other solvent having negative excess free energy of mixing with PDMS), or a hydrolyzed poly(hydromethylsiloxane) substrate may be exposed to a fluid (e.g., pressurized supercritical carbon dioxide) that causes the substrate to swell. Thereafter, the substrate is subjected to the fluid (e.g., by vapor deposition) to form the first distribution of the component on the swelled surface. The surface is then deformed by de-swelling the substrate to thereby form the second gradient distribution. The substrate may be de-swelled by removing the swelling agent (e.g., by exposing to increased temperature or vacuum). Where the substrate is formed of poly (hydromethylsiloxane) and swelled with supercritical carbon dioxide, the substrate may be de-swelled by depressurizing the supercritical carbon dioxide to relax the substrate.

According to certain embodiments, it may be desirable to affix the substrate (e.g., a PDMS film) to a rigid carrier (e.g., formed of metal or silicon) which may be flat. The substrate may be affixed to the carrier by casting the uncured substrate material on the carrier and curing the material in situ. The substrate may be affixed to the carrier prior to swelling the substrate. A plurality of cuts or grooves are preferably formed in the surface of the substrate prior to swelling. Preferably, the grooves extend perpendicularly to the direction of elongation. The grooves serve to provide more uniform stress distribution and thereby reduce or eliminate separation of the substrate from the carrier as the substrate is swelled.

Figure 3:
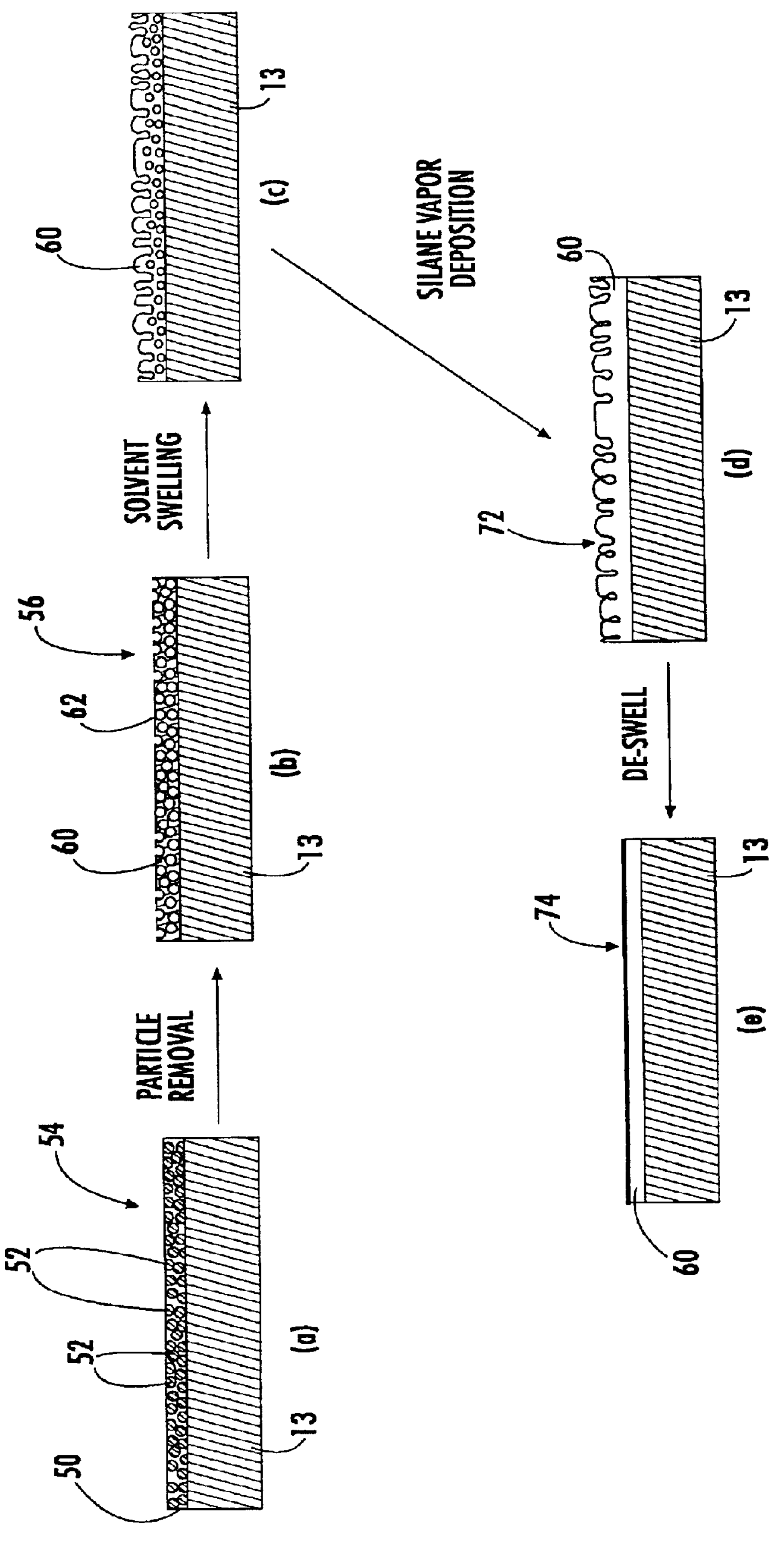
FIGS. 3(*a*)–(*e*) are schematic diagrams illustrating a method for forming chemically patterned substrates according to further embodiments of the present invention.

With reference to FIG. 3, a chemical gradient may be formed on a carrier 13 in the following manner. In order to prepare a substrate for swelling, the following process is employed. The uncured substrate material 50 (e.g., PDMS) may be mixed with particles 52 such as latex particles. The mixture 54 is cast on the carrier 13 and cured as shown in FIG. 3(*a*). The particles 52 are then chemically removed from the network, producing a porous network 56 as shown in FIG. 3(*b*). The porous network 56 serves as the swellable substrate 60 having a surface 62. In some cases, the particle removal step and the swelling step can be performed together. For example, polystyrene spheres may be used as the particles 52 and toluene as both the particle removal agent and the swelling agent.

The substrate 60 is swelled as discussed above (FIG. 3(*c*)) and the component is deposited on the surface 62 using any suitable technique (e.g., using vapor deposition as discussed above) to form a first distribution 72 of the component that is a gradient (FIG. 3(*d*)). The substrate 60 is then de-swelled to convert the first distribution 72 a second distribution 74 that is a denser gradient (FIG. 3(*e*)).

In the methods described above, the surface 12 is elongated or compressed in the same direction as the intended gradient of the second distribution. According to further embodiments, the surface 12 is elongated or compressed in a direction transverse to the intended gradient of the second distribution. For example, with reference to FIGS. 4(*a*)–(*d*), the following steps may be employed. For purposes of explanation, the method will be described with reference to a method wherein the deformation is achieved by stretching and allowing the substrate to elastically return to a terminal configuration. However, it will be appreciated that others of the various techniques described above may be modified to include the technique described below.

Figure 4:
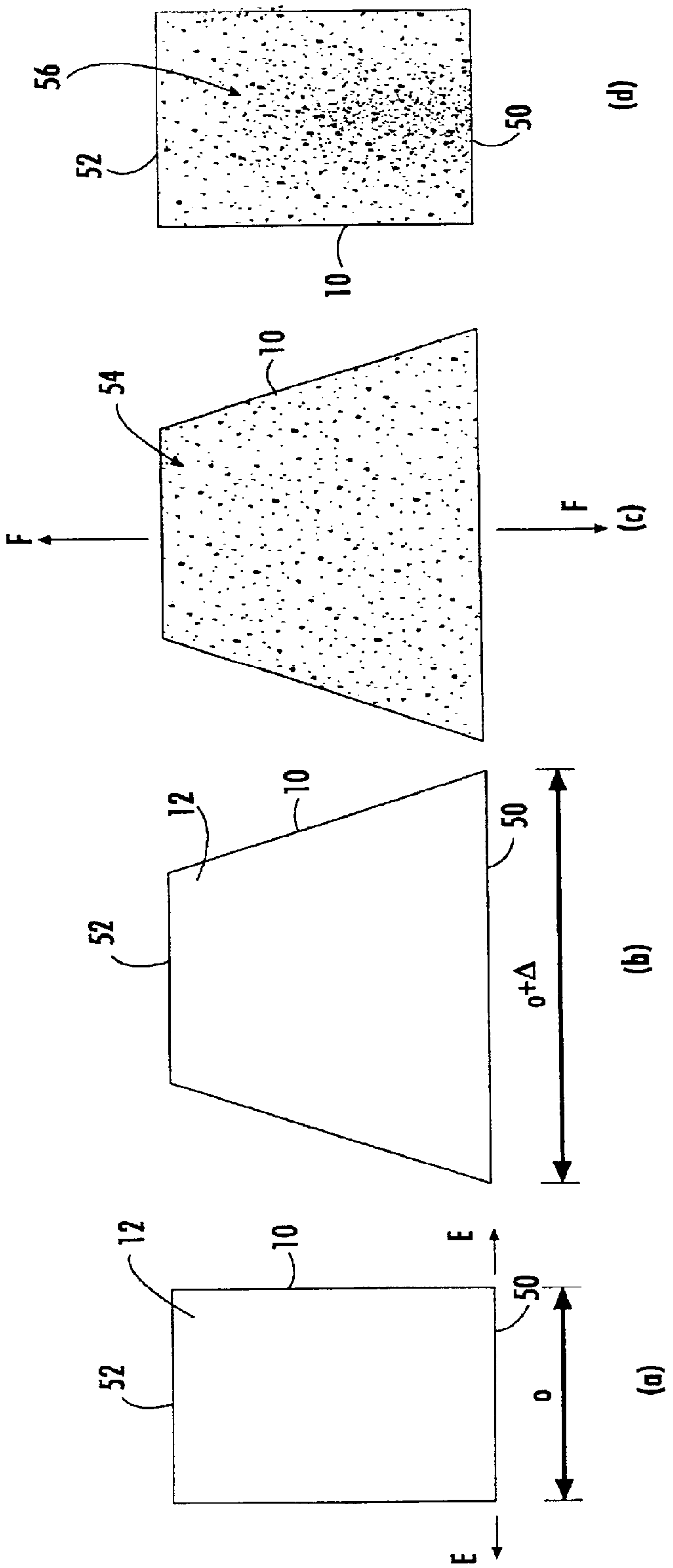
FIGS. 4(*a*)–(*d*) are schematic diagrams illustrating a method for forming a chemically patterned substrate according to further embodiments of the present invention.

The substrate 10 as shown in FIG. 4(*a*) is pulled along an end edge 50 and an axis E—E (i.e., from an initial length $l_o$ to an elongated length $l_o+\Delta l$) to asymmetrically, elastically elongate the surface 12 to a generally trapezoidal shape as shown in FIG. 4(*b*). The amount of elongation of the surface 12 is a gradient that varies monotonously from the end edge 50 to an opposing end edge 52. With the surface 12 retained in this elongated shape, the UVO or other treatment may be applied.

With the surface 12 still in the elongated shape, the surface 12 is subjected to the fluid including the component. The vapor may be homogenously supplied to the surface 12 such that a uniform first distribution 54 as illustrated in FIG. 4(*c*) is formed on the surface 12 rather than a gradient. Any suitable means may be used to homogenously deposit the component on the surface 12, such as a uniform concentration vapor atmosphere or a liquid bath.

Alternatively, the vapor may be supplied from a vapor source disposed along the elongated edge 50 in the manner discussed above with reference to FIGS. 1(*a*)–(*f*). In this case, the first distribution (not shown) of the component attached to the surface 12 will be a gradient extending along an axis F—F transverse to the axis E—E of elongation.

Following deposition of the first distribution (e.g., the first distribution 54) of the component on the elongated surface, the elongated substrate 10 is released. The surface 12 is thereby allowed to elastically return to a terminal shape and area as shown in FIG. 4(*d*) (which illustrates a construction as in FIG. 4(*c*) having a uniform first distribution 54). It will be appreciated that in the event the induced elongation extended into the viscoelastic or viscous range for the substrate material, the surface 12 will not return fully to its original length.

As will be apparent from the schematic drawing of FIG. 4(*d*), the uniform first distribution 54 is thereby converted to a second distribution 56 that is a gradient extending from the formerly stretched edge 50 (high density) toward the opposing edge 52 (low density). In the alternative case where the first distribution is a gradient extending along the axis F—F as discussed above, the first distribution will be converted to a second distribution (not shown) that is a gradient extending along the axis F—F more steeply than the first distribution.

Various modifications to the foregoing method may be made. In particular, various features and aspects of other methods as described herein may be used. For example, the substrate may be elongated by swelling or other means rather than by pulling. The substrate may be provided in the trapezoidal or other suitable shape and deformed using means other than the elasticity of the substrate (e.g., the substrate may be selectively heat-shrunk or chemically reduced).

According to still further embodiments, following formation of the first distribution, the surface 12 may be deformed (elongated or compressed) such that the deformation graduates along the axis the gradient of the second distribution is intended to follow. That is, the displacement of the surface itself as a result of the deformation is a gradient as a function of position along the axis of deformation. Prior to such deformation, the surface is subjected to the fluid such that the component forms a first distribution that is a gradient along the selected axis or is homogenous. If the first distribution is homogenous, the deformation converts the first distribution to a second distribution that is a gradient along the selected axis. If the first distribution is a gradient along the selected axis, the deformation converts the first distribution to a second distribution gradient along the selected axis that is steeper than the first.

Figure 5:
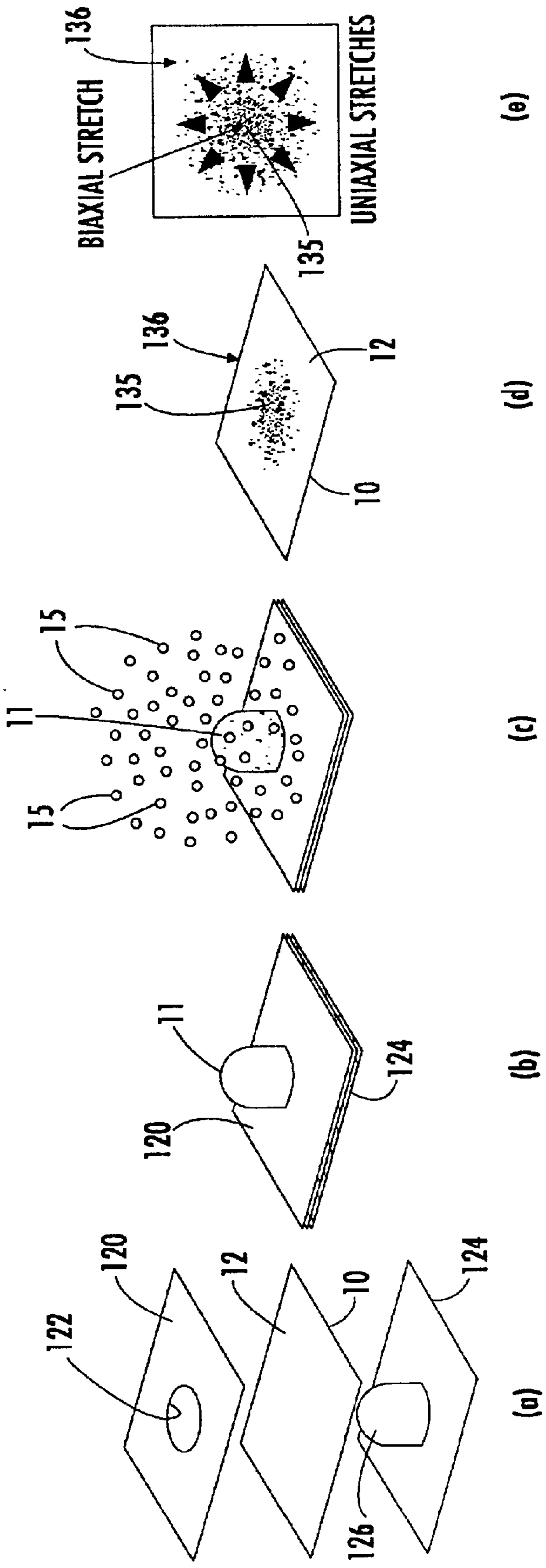
FIGS. 5(*a*)–(*e*) are schematic diagrams illustrating a method for forming a chemically patterned substrate according to further embodiments of the present invention.

With reference to FIGS. 5(*a*)–(*e*), the following method according to embodiments of the invention may be used to form a molecular gradient 136 extending radially outwardly from a central point 135 on a surface 12 of a substrate 10. The substrate 10 is formed of an elastic material as described above (e.g., PDMS).

The substrate 10 is sandwiched between a first plate 120 having a circular opening 122 and a second plate 124 having a solid rod 126 extending therefrom. The diameter of the rod 126 is slightly smaller than the diameter of the opening 122.

As the rod 126 is inserted through the opening 122 as shown in FIG. 5(*b*), a portion 11 of the substrate 10 is thereby stretched as shown in FIG. 5(*c*) while a surrounding portion of the substrate 10 is captured between the plates 120, 124. The substrate 10 is elongated uniaxially in the direction parallel to the rod 126, but is elongated biaxially at the top of the rod 126. As a result, the degrees of elongation differ, presenting gradient stretching.

The stretched, exposed portion of the substrate 10 is then treated, for example, using a UVO treatment, to produce hydrophilic groups thereon. The stretched, exposed portion of the substrate 10 is subjected to a fluid including the desired component 15 (e.g., functional group), for example, using a vapor deposition technique as discussed above. The component 15 is homogenously deposited on the stretched, exposed portion of the substrate 10 as shown in FIG. 5(*c*).

The plates 120, 124 are then removed, allowing the substrate 10 to return to or toward its relaxed condition. In this manner, the radial gradient 136 is formed as shown in FIGS. 5(*d*)–(*e*) with decreasing concentration as the gradient extends radially outwardly from the central point 135. In FIG. 5(*e*), arrows are provided to schematically illustrate the gradient stretching caused by the rod 126.

The parameters of the radial gradient can be tailored in the same manner as described above with regard to the method of FIG. 1, and also by selection of the diameter and height of the rod 126.

While the foregoing methods have been described with respect to patterned surfaces each having a second distribution with a gradient extending along a selected axis or axes, it is also contemplated that a patterned surface may be formed having multiple gradients. Graduated distributions may be formed on opposite sides of the substrate or on different portions of the same side.

Where multiple gradients are formed, the gradients may extend along different directions. Each of the gradients may be formed by any suitable means. For example, each of the gradients may be formed using a deformation step as described herein or using the technique described in Chaudhury and Whitesides, *Science*, 256, 1539–1541 (1992) without deformation. Where deformation is not required, the substrate may be, for example, a metal, a metal-containing oxide, or a silicon wafer with an oxide group disposed on the target surface.

Figure 6:
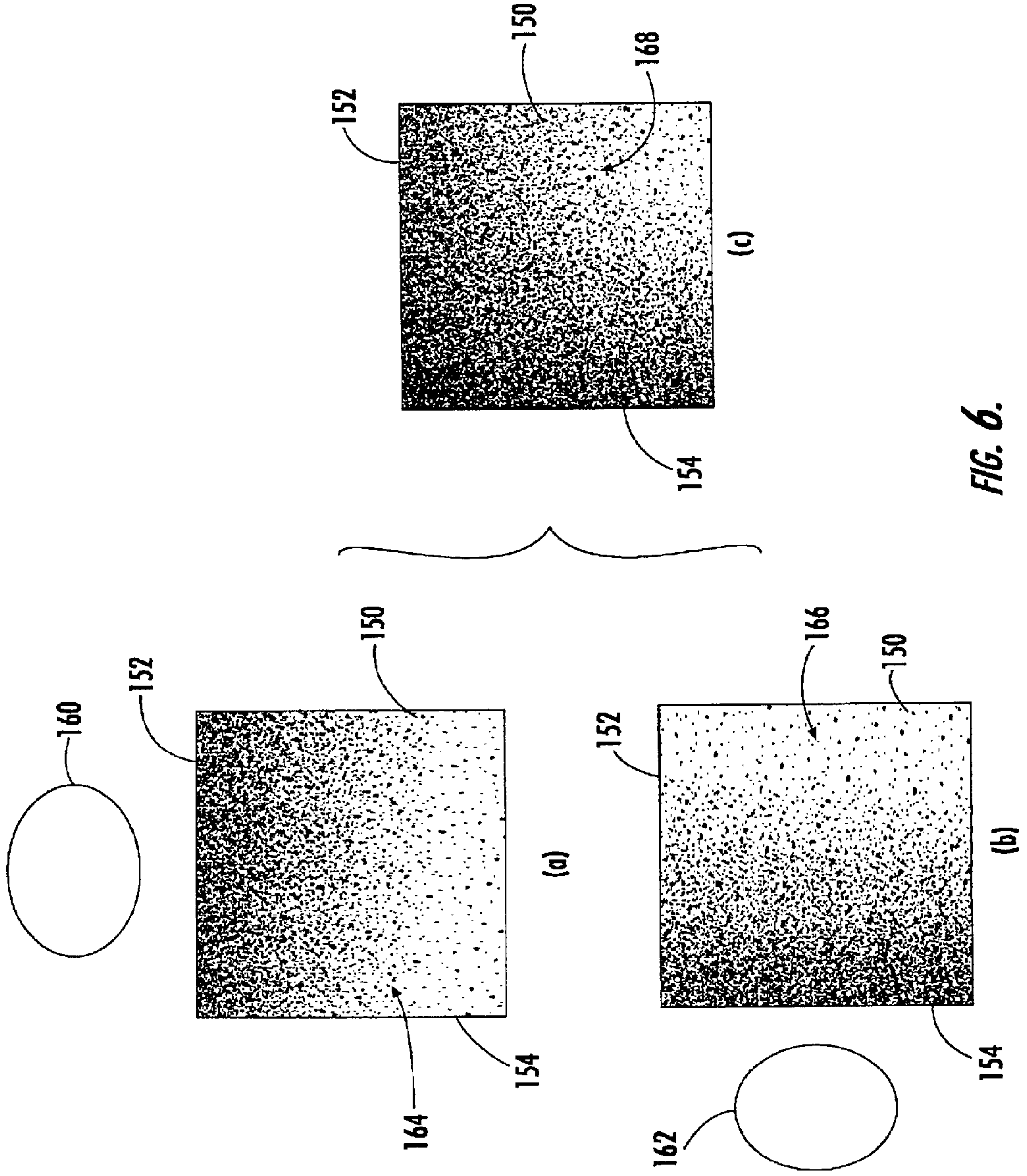
FIGS. 6(*a*)–(*c*) are schematic diagrams illustrating a method for producing a chemically patterned substrate according to further embodiments of the present invention.

By way of example and with reference to FIGS. 6(*a*)–(*c*), two vapor sources 160, 162 can be placed along two neighboring edges 152, 154 of a substrate 150. By diffusing one material or component (hereinafter "A") from the vapor source 160 on one side of the substrate and another component (hereinafter "B") from the vapor source 162 on a side non-parallel with the first diffusing source, a gradient 164 of A (FIG. 6(*a*)) and a gradient 166 of B (FIG. 6(*b*)) can be formed on the substrate surface. Together, the gradients 164, 166 may be said to form a combined gradient 168 having a complex diffusing profile. The surface may be subjected to the vapors from the two vapor sources 160, 162 at the same time or separately. FIG. 6(*c*) schematically illustrates the patterned surface having the combined gradient 168 chemically patterned thereon.

Alternatively, one of the first and second gradients 164, 166 may be formed using a liquid (e.g., dipping in a liquid bath) or other fluid source in place of a vapor source. The substrate may be subjected to the vapor sources (or vapor and liquid sources) at the same time or at different times (i.e., sequentially).

The substrate 150 may be any suitable substrate. In addition to the substrate materials discussed above, the substrate may be formed of silicon (e.g., a silicon wafer having an oxide group thereon), metal or a metal-oxide.

The second component may be separate from and nonreactive with the first component so that the second distribution fills in the voids on the surface between the attached components of the first distribution. Alternatively, the second component may be selected to react with or modify the first component. For example, the second component may change the first component from neutral to charged. In this manner, neutral/chargeable gradients may be formed.

Patterned substrates as just described may be used as detection targets, for example. By way of example, A may be a $—CH_3$-terminated chlorosilane and B may be a $—NH_2$-terminated chlorosilane. One can produce a complex gradient that changes from hydrophobic to hydrophilic in one direction and cationic to anionic in the other direction. A molecule (such as a complex biomolecule) adsorbing on such a substrate will choose an optimum combination of bydrophobic/cationic forces. Thus, by measuring the X–Y coordinates of the adsorbing molecules on the substrates one can measure conveniently the adsorption properties of complex molecules species.

Figure 7:
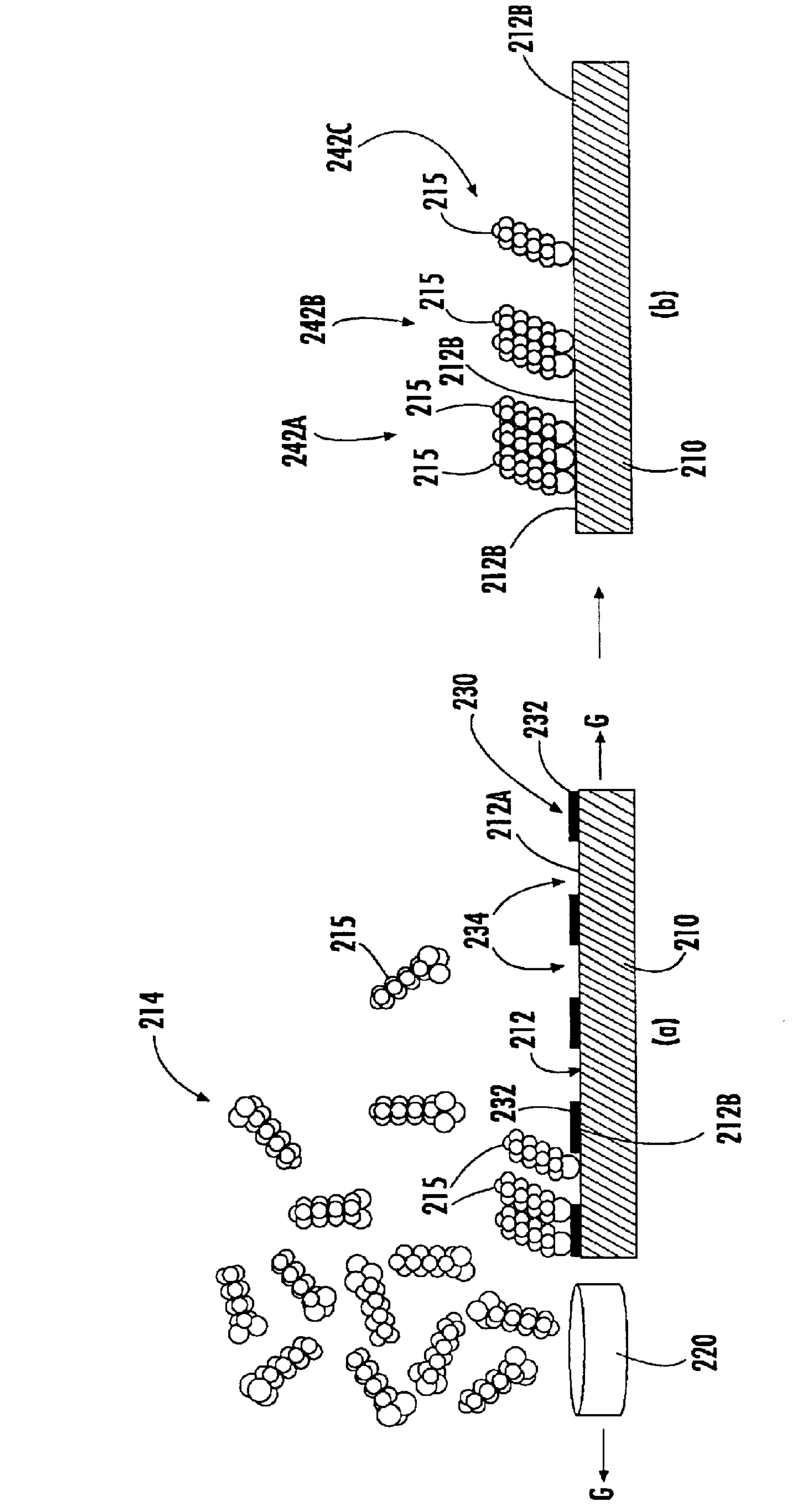
FIGS. 7(*a*) and 7(*b*) are schematic diagrams illustrating a method for forming a chemically patterned substrate according to further embodiments of the present invention.

With reference to FIGS. 7(*a*)–(*b*), a chemical pattern gradient 240 of a component 215 may be formed on a surface 212 of a substrate 210 such that component voids are present in the pattern on the surface 212. The surface 212 is covered with a mask 230 defining openings 234. The mask includes portions 232 extending transversely, and preferably perpendicularly, to a selected gradient axis G—G.

The masked surface 212 is subjected to the fluid 214 including the component 215 to form a gradient 240 (FIG. 7(*b*)) extending along the axis G—G. The gradient may be formed by any suitable means. For example, the gradient 240 may be formed using a deformation step as described herein or using the technique described in Chaudhury and Whitesides, *Science*, 256, 1539–1541 (1992) without deformation. The mask 230 may thereafter be removed.

The fluid 214 is prevented by the mask portions 232 from imparting the component 215 to the covered portions 212B of the surface 212. As a result, a plurality of discrete gradient sections 242A, 242B, 242C are formed on the surface 212. The gradient sections 242A, 242B, 242C each include a gradient of the component 215. The gradient sections 242A, 242B, 242C collectively define the overall discontinuous gradient 240 having voids where the mask 230 separates the adjacent discrete gradient sections 242A, 242B, 242C.

The various features and aspects as described above may be used in conjunction with the mask 230.

The patterned substrates discussed above can also serve as flexible protection materials, as well as anti-fouling, non-reconstructive surfaces and active filters for gases and liquids. The substrates (particularly in the form of films) may be capable of being attached to other materials through its non-modified side. Such surfaces can be applied to any surface that needs to be modified, i.e., function as a sticker or a "Post-It®-type" surface.

EXAMPLE 1

Chemical gradients are formed on silicon oxide-covered silicon wafers. A Teflon machined block is placed on the bottom of a plastic Petri dish. A silicon wafer, previously treated with the UV/ozone (UVO) treatment that produces —OH functionalities $[—OH]_{surface}$ on the silicon wafer, is placed in the middle of the Teflon block. The slits on the edge of the Teflon block are filled with the chlorosilane:paraffin oil mixture and the Petri dish is covered with the plastic lid. As the chlorosilane molecules evaporate, they form a diffusion gradient in the vapor phase and due to gravity impinge on the silicon wafer after some time. Assuming that the concentration of $[—OH]_{surface}$ is very high, once the molecule adsorbs at the surface, it is believed to react with the $[—OH]_{surface}$ groups forming a covalently attached $R—Si{\equiv}O—[Si]_{surface}$ complexes by following the set of reactions given in the following reaction scheme:

(scheme 5)

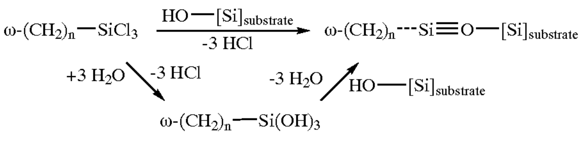

wherein n=1 to 100,000.

Assuming the process of diffusion is controlled only by the molecule transport in the vapor phase, once the molecule adsorbs on the surface, its mobility is essentially zero. Under these conditions, the concentration of the molecules on the surface of the silicon wafer decreases with increasing distance from the diffusion source. By controlling the diffusion time, the diffusion front propagates further away from the diffusion source.

Figure 8:
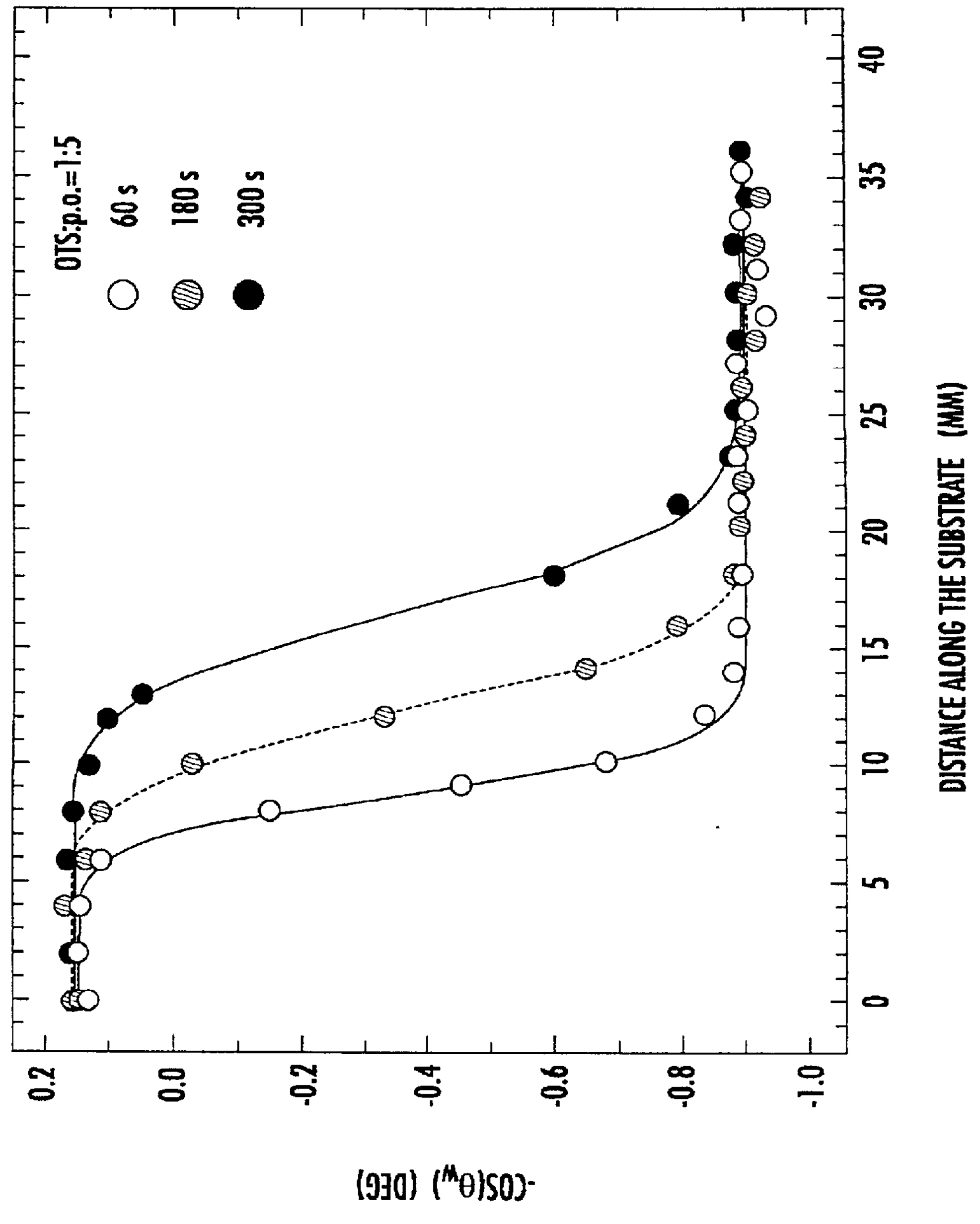
FIG. 8 illustrates water contact angle data for OTS-based gradients along a silicon oxide wafer deposited using one diffusion source.
Figure 9:
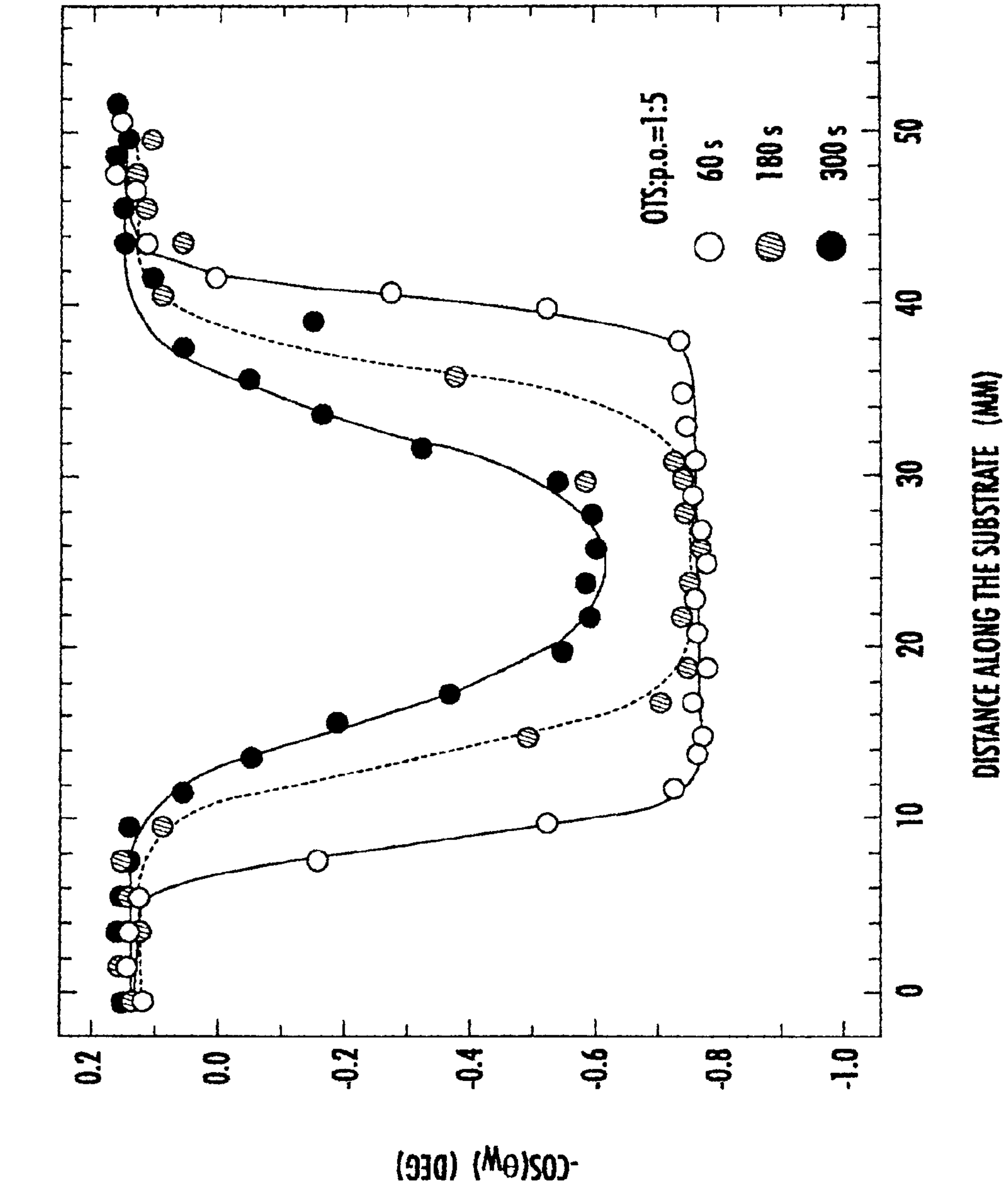
FIG. 9 illustrates water contact angle data for OTS-based gradients along a silicon oxide wafer deposited using two opposite diffusion sources.

In one embodiment, two materials were used to produce the surface energy gradients: ocyltrichlorisolane ($H_3C(CH_2)_7SiCl_3$, OTS) and oct-enyltrichlorosilane ($H_2C{=}HC(CH_2)_6SiCl_3$, OETS). It should be appreciated that other materials may be used without departing from the scope of the invention. The variation of the surface energy was determined using the water contact angles measured using the contact angles goniometer. FIGS. 8 and 9 shows the variation of the water contact angle ($\theta_{water}$) along the wafer for the case of one OTS diffusion source (FIG. 8) and two opposite OTS diffusion sources (FIG. 9). As is apparent from FIGS. 8 and 9, at each diffusion time, the water contact angles changes gradually indicating that the surface of the silicon wafer has a gradient in the surface energy. Specifically, the surface is very hydrophobic close to the diffusion source ($\theta_{water}\approx100°$) indicating a large concentration of the adsorbed OTS molecules. As one moves away from the diffusion source, the concentration of OTS decreases and, at a large distance from the diffusion source falls to zero as demonstrated by the low water contact angles ($\theta_{water}\approx25°$). By increasing the process time, the diffusion front moves away from the source, as expected, and for the case of the diffusion from two opposite sources the two opposite diffusion fronts meet and overlap.

Figure 10:
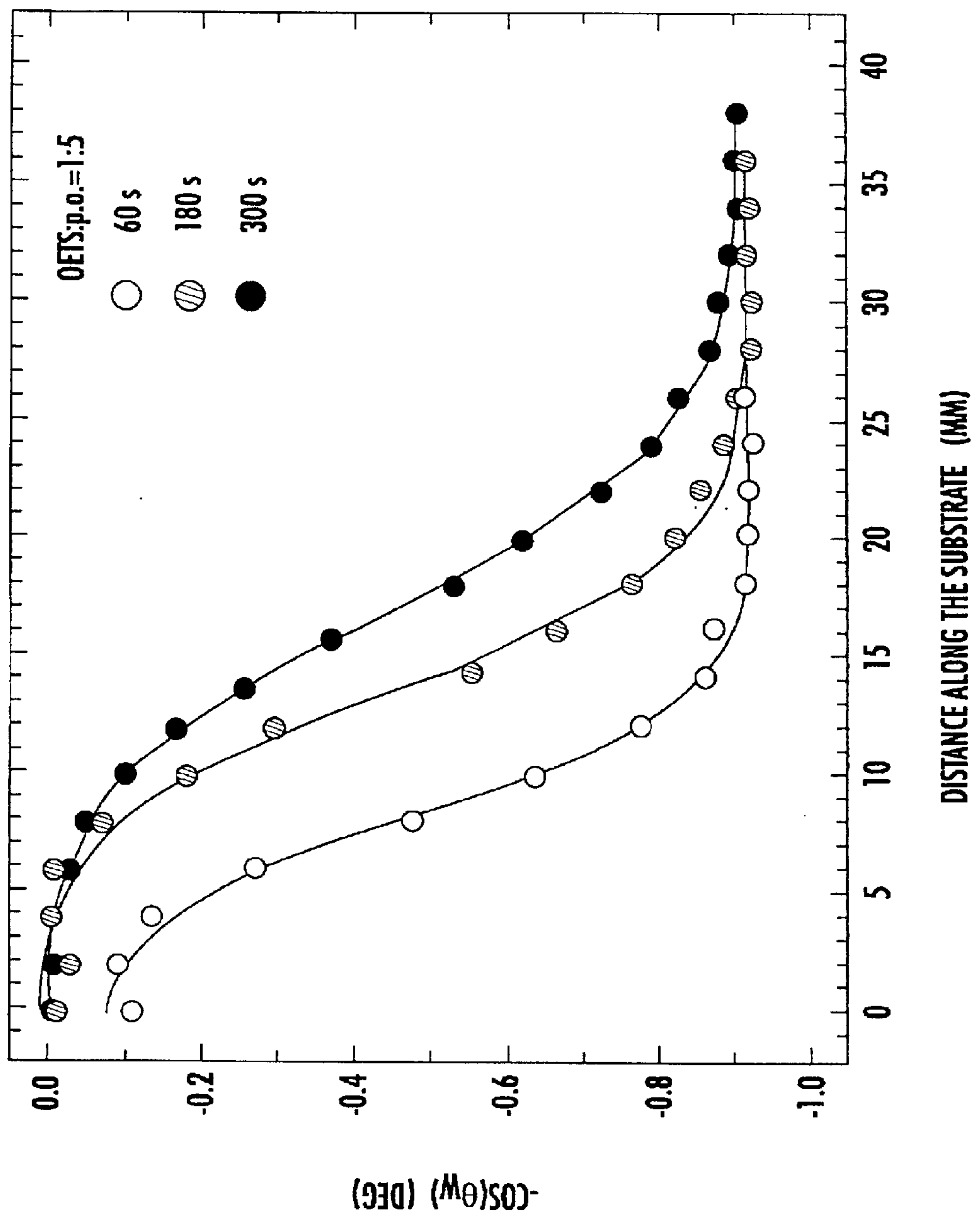
FIG. 10 illustrates water contact angle data for OETS-based gradients along a silicon oxide wafer deposited using one diffusion source.
Figure 11:
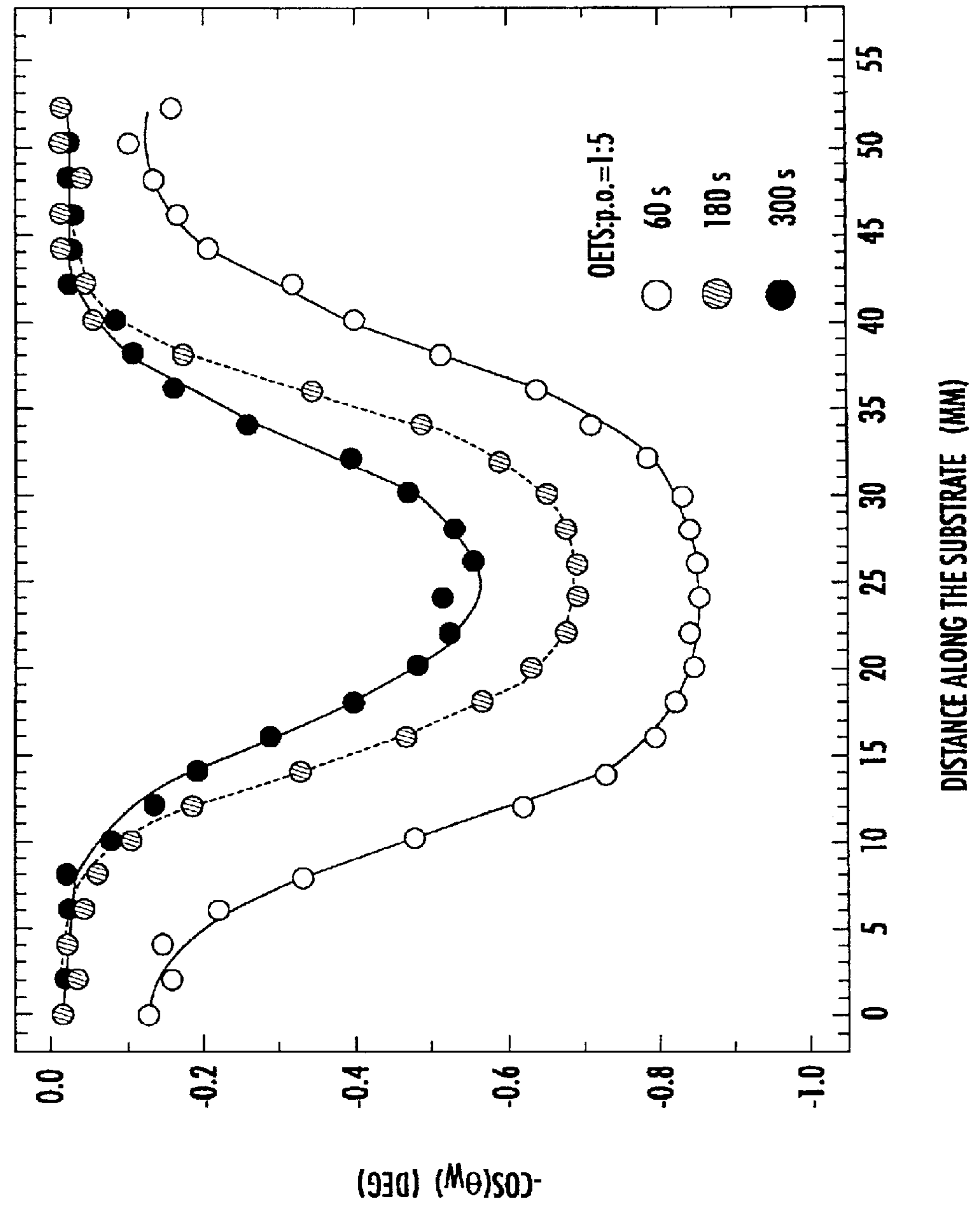
FIG. 11 illustrates water contact angle data for OETS-based gradients along a silicon oxide wafer deposited using two opposite diffusion sources.

Similar results can be obtained using the OETS molecules. FIGS. 10 and 11 shows the variation of the water contact angle along the wafer for the case of one OETS diffusion source (FIG. 10) and two opposite OETS diffusion sources (FIG. 11). Similar to the OTS case, the water contact angles changes gradually indicating the presence of a surface energy gradient. A comparison of the water contact angles on OTS and OETS gradient surface reveals that the gradients made of the OTS molecules are steeper that those fabricated using the OETS molecules. This observation indicates that the OETS molecules diffuse faster than the OTS ones.

Assuming that the change in cosince the water contact angle is directly proportional to the change in the concentration of the chlorosilane molecules on the surface, we fitted the variations of $-\cos(\theta_{water})$ to Eqs. 1 and 2 describing the one-dimensional diffusion of a species from an infinite diffusion source as follows:

$$c(z) = -\cos(\theta(z)), \quad (1)$$

$$c(z) = c(\infty) + \frac{c(0) - c(\infty)}{2}\operatorname{erfc}\left(\frac{z - z_o}{2\sqrt{D \cdot t_{Diff}}}\right), \quad (2)$$

The experimental data were fitted to Eq. (2), allowing c(0), c(∞), and $z_o$ to vary. The experimental data involving the diffusion from two opposite sources have been fitted to:

$$c(z) = c(\infty) + \frac{c(0) - c(\infty)}{2}\operatorname{erfc}\left(\frac{z - z_{o,L}}{2\sqrt{D_L t}}\right) + \frac{c(H) - c(\infty)}{2}\operatorname{erfc}\left(\frac{z_{o,R} - z}{2\sqrt{D_R t}}\right), \quad (3)$$

where c(0) and c(H) are the cosines of the water contact angles close to the left and right diffusion sources, respectively, c(∞) is the cosines of the water contact angle in the middle of the profile, z is the distance along the substrate, and $Z_{o,L}$ and $Z_{o,R}$ are the positions of the left and right, respectively, diffusing fronts (measured from the left diffusing source), $D_L$ and $D_R$ are the diffusion constants describing the diffusion from the left and right, respectively, diffusion sources, and t is the diffusion time.

In this embodiment, the diffusion $D_{OETS}>D_{OTS}$, because the vapor pressure of the OETS is higher than that of OTS.

Moreover, the fact that the diffusion constants obtained from the fits are virtually the identical, indicates that the process is controlled predominantly by one diffusion process—the mass transport through the vapor phase.

The foregoing methods provide limited control over the gradient parameters. Specifically, the "height" and "depth" of the gradient can be varied by changing the chemical nature of R. The steepness of the diffusion front can to some extend be controlled by adjusting the vapor pressure of the diffusing source (for example, by varying the evaporation temperature). For some applications, particularly those in which gradients are used as separation or transport media, one would need or desire additional controls over the gradient properties as provided by methods of the present invention and exemplified by the following example.

EXAMPLE 2

The following technique is based on the combination of i) the well known grafting reaction between R—$SiCl_3$ molecules and —OH functionalities present on silicon-based surfaces (scheme 5), and ii) mechanical manipulation of the grafted R—Si≡ molecules on the substrate. The method consists of five operational steps.

First, a pristine poly(dimethyl siloxane) network (PDMS) film is prepared by casting a mixture of PDMS and a cross-linker into thin a (≈0.5 mm) film and curing at 55° C. for about an hour. In this embodiment, the PDMS films are prepared from the commercial PDMS Sylgard® 184 and the curing agent 184 made commercially available from Dow Corning.

In the second step, the cross-linked PDMS substrate is cut into small strips (≈1×5 $cm^2$) and the strips are stretched along their longer sides to various strains, Δx.

In the subsequent step, each stretched substrate is exposed to a UVO treatment to produce the $[—OH]_{surface}$ functionalities (PDMS-UVO).

In the fourth step, the gradient surface is prepared by allowing the vapor of R—$SiCl_3$ to diffuse over the PDMS-UVO substrate, as described previously.

Finally, in the fifth step, the strain is released from the stretched substrate and the PDMS-UVO film (which is now covered with a gradient SAM layer) returns to its original size.

The foregoing method was conducted with the PDMS substrate stretched to various Δx and exposed to UVO for 30 or 45 minutes. The flux of OTS in the diffusing front was controlled by changing the ratio OTS:paraffin oil. Specifically, ratios 1:1 (concentrated vapor) and 1:10 ("starving" vapor) were used. The OTS was diffused across the PDMS-UVO substrate for time T ranging from 3 to 5 minutes. The gradient surfaces were characterized with contact angle measurements as previously described.

Figure 12:
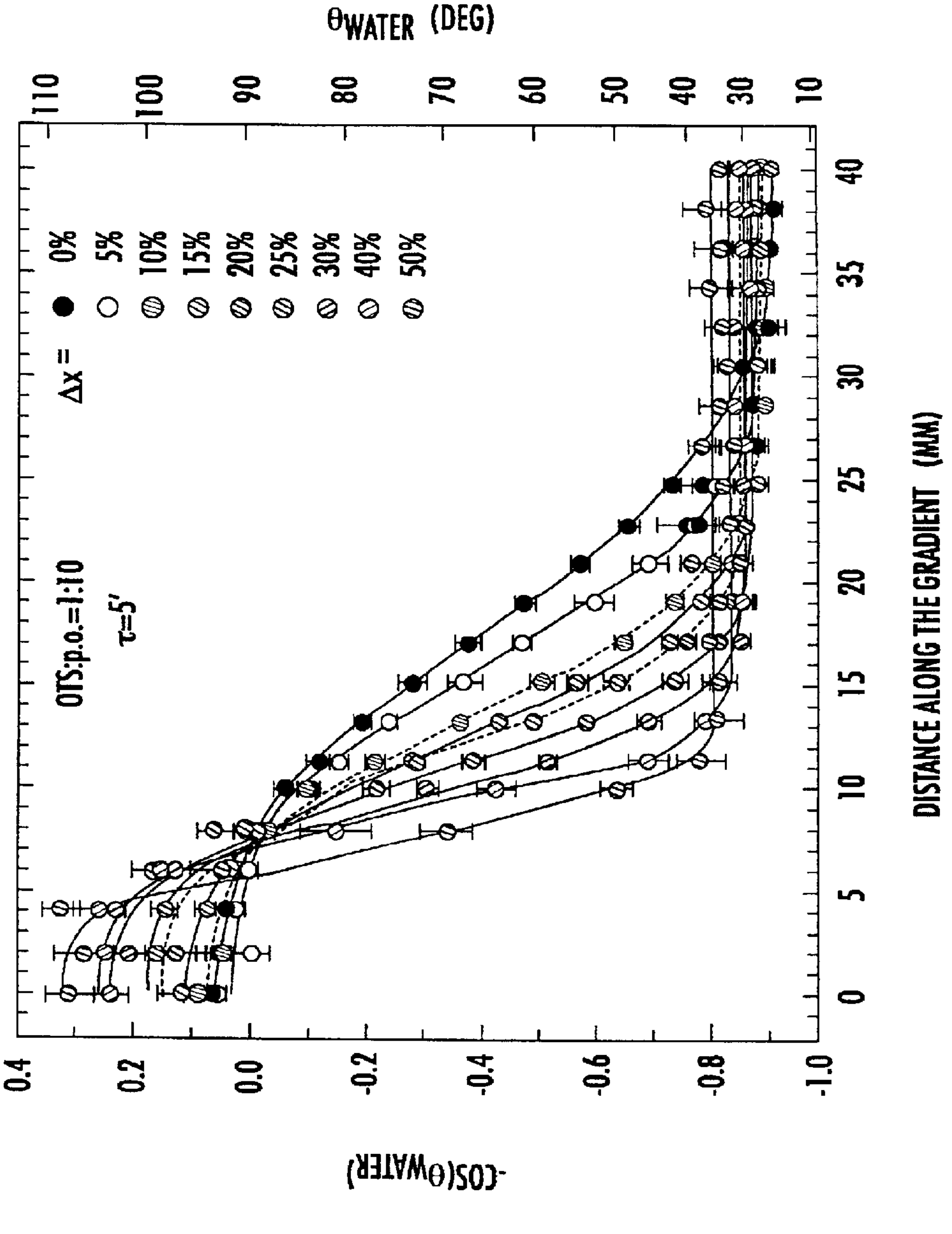
FIG. 12 illustrates water contact angles of distilled water along gradient substrates prepared on PDMS network films previously extended by $\Delta x$ ranging from zero percent to fifty percent and treated with UVO for thirty minutes, the gradients being posited from vapor consisting of OTS:P.O.=1:10 mixtures.
Figure 13:
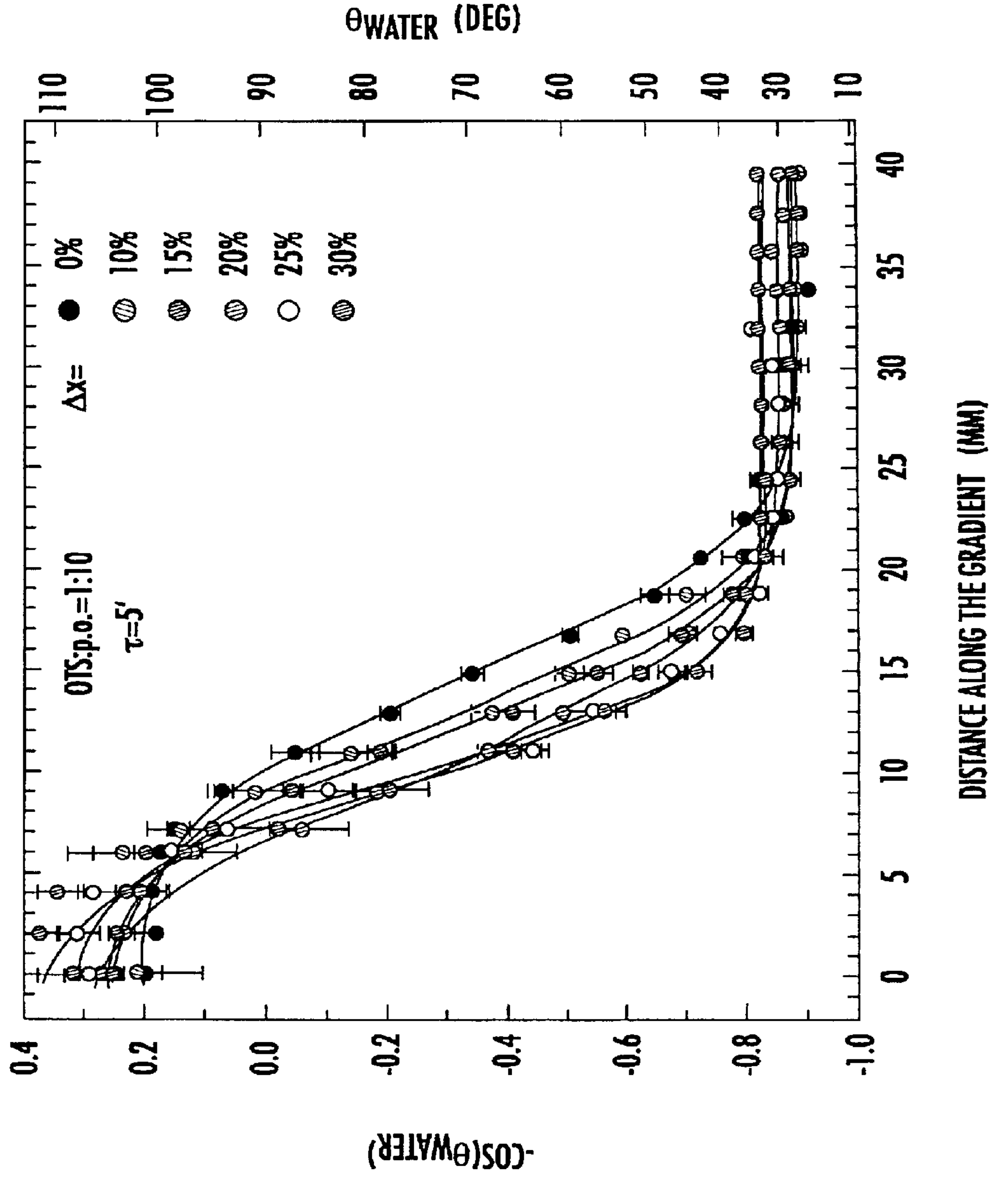
FIG. 13 illustrates water contact angles of distilled water along gradient substrates prepared on PDMS network films previously extended by $\Delta x$ ranging from zero percent to thirty percent and treated with UVO for forty-five minutes, the gradients being posited from vapor consisting of OTS:P.O.=1:10 mixtures.

FIG. 12 shows contact angles of double distilled water along gradient substrates prepared with Δx ranging from 0% to 50%. In all cases OTS:p.o.=1:10 and t=5 mins and the UVO treatment was 30 minutes. The data show that, as expected, the gradient steepness changes with changing the Δx. Specifically, the diffuse region broadness decreases from ≈40 mm down to 15 mm as Δx increases from 0% to 50%. In all cases the profiles exhibit excellent Fickian-type diffusion profiles. Similar experiments were conducted with different OTS:p.o. ratios and diffusion times. In addition, we repeated the above experiments on PDMS substrates that were exposed to UVO for 45 minutes. FIG. 13 shows contact angles of double distilled water along gradient substrates prepared with Δx ranging from 0% to 50%. In these examples, OTS:p.o.=1:10 and t=5 mins and the UVO treatment was 30 minutes. Comparing FIGS. 12 and 13 it is apparent that profiles in the latter case are narrower compared to their corresponding counterparts in FIG. 12. Notably, the parameters of the vapor (i.e., concentration of the diffusing species, temperature, humidity) were the same. The only difference between the two cases was the longer treatment of the PDMS substrate. To understand this behavior we analyze the data using Eqs. (1) and (2) and obtain two fitting parameters: the position of the diffusion front, $z_o$, and the diffusivity, Dt.

Figure 14:
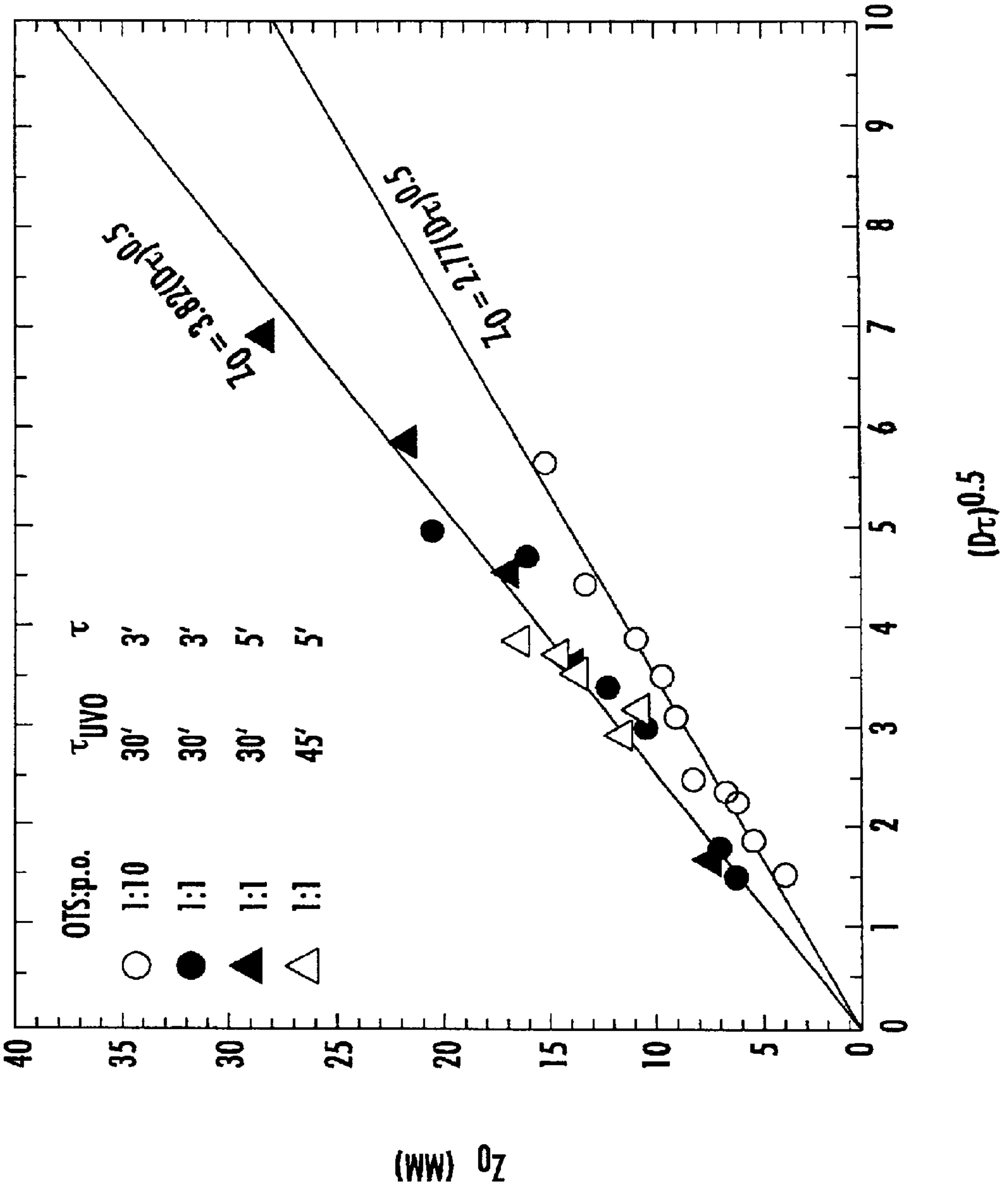
FIG. 14 illustrates position of diffusing front plotted as a function of a square root of diffusivity for samples prepared at various OTS:P.O. concentrations, diffusion times, and PDMS UVO treatment times.

FIG. 14 shows the dependence of the diffusivity on the square root of the diffusivity. As appears to be the case, the dependence is a straight line. However, the data in FIG. 14 seems to follow two different trends, the determining factor seems to be the concentration of the diffusing species in the vapor phase. Specifically, for OTS:p.o.=1:1 the slope of the $z_o$ vs. $(Dt)^{0.5}$ dependence is 3.82, while for OTS:p.o.=1:10 the same slope has a value of 2.77. Recall that in the latter case the concentration of the OTS molecules in the vapor phase is ≈10 times smaller. At low OTS concentration in the vapor phase, all OTS molecules that adsorb at the PDMS-UVO substrate immediately react with the surface —OH groups, so the diffusion path these molecules travel along the PDMS-UVO substrate is minimal. However, when a large number of OTS molecules adsorb at the PDMS-UVO substrate at the same time, as is the case of the OTS:p.o.=1:1, they have to "compete" for the adsorbing —OH groups. Only one of these molecules reacts and the other species have to diffuse on the surface "searching" for free —OH groups on the PDMS-UVO surface. So, while in the OTS:p.o.=1:10 case, the process is controlled predominantly by the diffusion in the vapor, in the latter case, the combination of the vapor and surface diffusion of the OTS molecules governs the concentration profiles of OTS on the substrate. There is a delicate interplay between the number of the adsorbing molecules and the concentration of the surface —OH groups that dictates the broadness of the OTS concentration profiles.

More information about the system behavior can be obtained by plotting the position of the diffusion front for samples with various Δx normalized by $z_o$ (Δx=0) as a function of the degree of stretching of the PDMS substrate before the UVO treatment. In the ideal case—when all OTS molecules that adsorb at the substrate stick at the position at which they were incorporated into the structure—the slope of the above dependence (k) should be one. For k<1, the rate at which the slope of the profile changes is slower than the ideal situation indicating that the molecules "slide" along the substrate during the strain removal. However, for k>1 the rate of the profile change is faster than the ideal case, which suggests that some of the molecules were either pulled out of the structure or were forced to hide underneath the substrate when the strain was removed from the stretched PDMS substrate.

Figure 15:
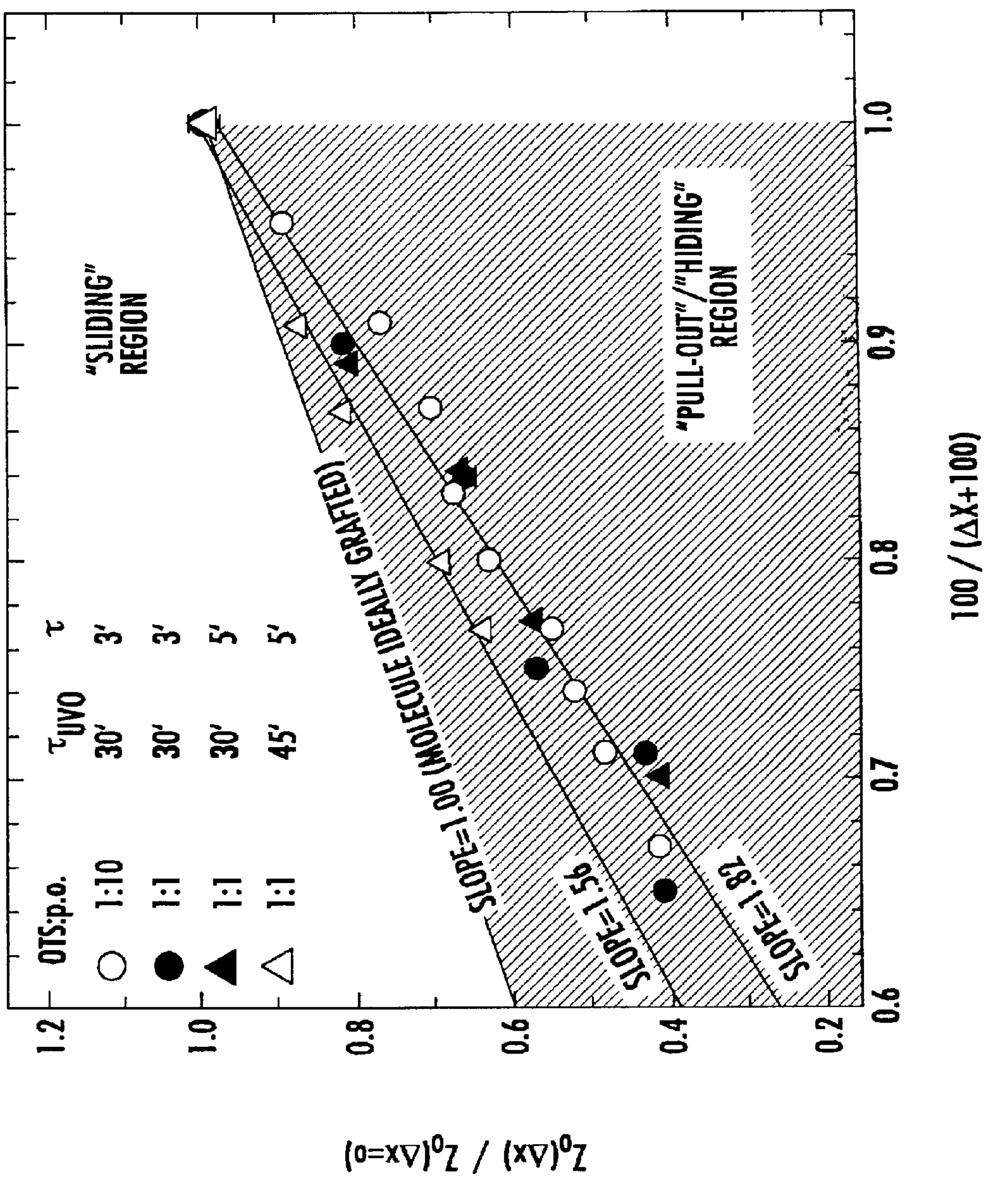
FIG. 15 illustrates normalized position of the diffusion front as a function of substrate extension.

Our data have slope k>1, indicating that the molecules are in the "pull-out"/"hiding" region. The data in FIG. 15 splits into two groups, depending on the treatment time of the PDMS substrate. Specifically, the normalized $z_o$ from PDMS-UVO substrates treated for 30 minutes have k=1.82, and those prepared on PDMS-UVO substrates treated for 45 minutes have k=1.56. Hence, the latter set of data appears to exhibit a slower "pull-out" rate. Recall that the concentration of the surface —OH groups increases with increasing time. Thus, the different slope of the two data sets seems to suggest that when deposited on the PDMS-UVO substrates treated with UVO for 30 minutes, the molecules form covalent bonds with the substrate —OH groups and also in-plane ≡Si—O—Si≡ bonds. The latter bonds are responsible for pulling more molecules from the substrate when the strain is released. In the case of PDMS-UVO substrates treated with UVO for 45 minutes there are mainly bonds with the substrate and a minimum number of in-plane ≡Si—O—Si≡ bonds. Hence the molecules stay predominantly attached to the substrate when the strain is released from the stretched PDMS substrate.

Accordingly, the foregoing example demonstrates that the steepness and the position of the tunable molecular gradient on the substrate can be fine-tuned by simply choosing the right combination of $\Delta x$, $t_{UVO}$, $t_{Diff}$, and the flux of the chlorosilane molecules in the vapor phase. In addition, the wetting properties of the hydrophobic part of the substrate can be adjusted by altering the chemical nature of ω in the diffusing R—$SiCl_3$. Moreover, if desired, the chemical nature of ω can be further tailored using relatively simple chemistries after the MAM formation.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A method for forming a chemically patterned surface, said method comprising:

a) subjecting a surface of a substrate to a fluid including a component such that the component reacts with the surface to form a first distribution of the component on the surface; and thereafter b) deforming the surface along at least one axis such that the first distribution of the component is converted to a second distribution different from the first distribution;

c) wherein the second distribution is a gradient of the component.

2. The method of claim 1 wherein the gradient of the second distribution extends along a second axis which is transverse to the at least one axis along which the surface is deformed.

3. The method of claim 1 wherein the gradient of the second distribution extends along a second axis which is substantially parallel to the at least one axis along which the surface is deformed.

4. The method of claim 1 wherein the gradient is substantially ring-shaped and extends radially from a central point.

5. The method of claim 1 wherein the step of deforming the surface includes deforming the surface uniformly along the at least one axis.

6. The method of claim 1 wherein the step of deforming the surface includes deforming the surface monotonously and non-uniformly along the at least one axis.

7. The method of claim 1 wherein the step of subjecting the substrate to the fluid includes subjecting the substrate to a vapor including the component.

8. The method of claim 1 wherein the step of deforming the surface includes reducing the surface along the at least one axis.

9. The method of claim 8 wherein the step of reducing includes reducing the surface by between about 1 and 100 percent along the at least one axis.

10. The method of claim 8 further including elongating the surface along the at least one axis to an elongated state prior to the step of subjecting the surface to the fluid, and wherein the step of subjecting the surface to the fluid includes subjecting the elongated surface to the fluid.

11. The method of claim 10 wherein:

the step of elongating includes applying a load to the substrate to elongate the surface; and the step of reducing the surface includes allowing the surface to at least partially elastically return from the elongated state.

12. The method of claim 10 wherein the surface is asymmetrically elongated.

13. The method of claim 12 wherein the gradient of the second distribution extends along a second axis which is transverse to the at least one axis along which the surface is elongated.

14. The method of claim 10 wherein the step of elongating includes subjecting the surface to a swelling agent to swell the surface.

15. The method of claim 14 including forming a plurality of ridges in the surface to facilitate swelling of the surface by the swelling agent.

16. The method of claim 14 where the surface is formed of a rubbery network.

17. The method of claim 16 wherein the swelling agent is a fluid selected from the group consisting of a solvent and supercritical carbon dioxide.

18. The method of claim 14 wherein the surface is formed of a poly(dimethyl siloxane) network.

19. The method of claim 1 wherein the step of deforming the surface includes elongating the surface along the at least one axis.

20. The method of claim 1 wherein the first distribution is substantially uniform.

21. The method of claim 1 wherein the first distribution is a gradient of the component.

22. The method of claim 21 wherein:

the fluid is a vapor; and the step of exposing the surface to the fluid includes providing a vapor source adjacent the surface such that the vapor is generated from the vapor source and the gradient of the first distribution is a function of distance from the vapor source.

23. The method of claim 1 further including:

a) subjecting the surface to a second fluid including a second component such that the second component reacts with the surface to form a third distribution of the second component on the surface; and b) deforming the surface along at least one second axis such that the third distribution of the component is converted to a fourth distribution different from the third distribution;

c) wherein the fourth distribution is a gradient of the second component.

24. The method of claim 23 wherein at least one of the first and third distributions is uniform.

25. The method of claim 23 wherein the first distribution is a gradient of the first component and/or the third distribution is a gradient of the second component.

26. The method of claim 23 wherein the gradients of the second and fourth distributions extend in different directions.

27. The method of claim 1 further including, prior to the step of subjecting the surface to the fluid, providing a mask on the surface to form at least one exposed portion of the surface not covered by the mask and at least one covered portion of the surface covered by the mask, and wherein the step of subjecting the surface to the fluid is conducted such that the component reacts with the at least one exposed portion and is prevented from reacting with the at least one covered portion by the mask.

28. The method of claim 1 wherein, prior to the step of subjecting the surface to the fluid, the surface is modified to create at least one reactive group on the surface capable of reacting with the component of the fluid.

29. The method of claim 28 wherein the reactive group is selected from the group consisting of a hydroxyl group, a carboxyl group, a peroxide group, and combinations thereof.

30. The method of claim 28 wherein the step of modifying the surface includes chemically modifying the surface.

31. The method of claim 1 wherein the substrate comprises a network made of a component selected from the group consisting of natural rubber, synthetic rubber, butadienes, poly(dimethyl siloxane), and combinations thereof.

32. The method of claim 1 wherein the gradient provides the surface with a functional gradient selected from the group consisting of a surface energy gradient, a water absorption gradient, a charge gradient, and combinations thereof.

33. The method of claim 1 wherein the component is selected from the group consisting of monochlorosilane molecules, dichlorosilane molecules, trichlorosilane molecules, monoalkoxysilane molecules, dialkoxysilane molecules, and trialkoxysilane molecules.

34. The method of claim 1 wherein the step of subjecting the surface to the fluid includes conjugating the component as a monolayer on the surface.

35. The method of claim 1 wherein the step of subjecting the surface to the fluid includes grafting the component to the surface.

36. The method of claim 1 wherein the component is a polymer or a copolymer.

37. The method of claim 1 wherein the step of subjecting the surface to the fluid includes growing the component on the surface.

38. The method of claim 1 wherein the component is SH and the surface comprises a metal selected from the group consisting of gold, silver, copper, platinum, palladium, alloys thereof, and combinations thereof.

39. The method of claim 1 wherein the component comprises a protein molecule.

40. A method for forming a patterned surface, said method comprising:

a) enlarging a substrate having an initial surface portion to form an enlarged surface portion from the initial surface portion; then b) conjugating a functional group on the enlarged surface portion; and then c) reducing the substrate to form a reduced surface portion from the enlarged surface portion, with the reduced surface portion having an area less than the enlarged surface portion, and with the reduced surface portion having the functional group deposited therein at a greater density than the enlarged surface portion;

d) wherein the functional group in the enlarged surface portion forms a density gradient.

41. A method for forming a chemically patterned surface, said method comprising:

a) subjecting a surface of a substrate to a vapor including a first component such that the first component reacts with the surface to form a first distribution of the first component on the surface, the first distribution being a gradient of the first component; and b) subjecting the surface of the substrate to a fluid including a second component such that the second component reacts with the surface to form a second distribution of the second component on the surface, the second distribution being a gradient of the second component;

c) wherein the gradients of the first and second distributions extend in different directions.

42. The method of claim 41 wherein:

a) the step of subjecting the surface to the vapor includes providing a vapor source adjacent the surface such that the vapor is generated from the vapor source and the first distribution is a function of distance from the vapor source; and b) the step of subjecting the surface to the fluid includes providing a fluid source adjacent the surface such that the fluid is generated from the fluid source and the second distribution is a function of distance from the fluid source;

c) wherein the vapor source and the fluid source are positioned at different locations relative to the surface.

43. The method of claim 42 wherein the fluid source is a second vapor source and the fluid is a second vapor.

44. The method of claim 42 wherein the fluid source is a liquid source and the fluid is a liquid.

45. The method of claim 41 wherein the steps of subjecting the surface to the vapor and subjecting the surface to the fluid are performed at the same time.

46. The method of claim 41 wherein the steps of subjecting the surface to the vapor and subjecting the surface to the fluid are performed at different times.

47. The method of claim 41 wherein the first and second components are the same.

48. The method of claim 41 wherein the first and second components are different.

49. The method of claim 41 wherein the substrate is a silicon wafer.

50. The method of claim 49 wherein an oxide group is disposed on the surface.

51. The method of claim 41 wherein the substrate is formed of metal.

52. The method of claim 41 wherein the substrate is formed of a metal-containing oxide.

53. The method of claim 41 wherein, prior to the step of subjecting the surface to the vapor, the surface is modified to create at least one reactive group on the surface capable of reacting with the first component.

54. The method of claim 53 wherein the reactive group is selected from the group consisting of a hydroxyl group, a carboxyl group, a peroxide group, and combinations thereof.

55. The method of claim 53 wherein the step of modifying the surface includes chemically modifying the surface.

56. The method of claim 41 wherein the substrate comprises a network made of a component selected from the group consisting of natural rubber, synthetic rubber, butadienes, poly(dimethyl siloxane), and combinations thereof.

57. The method of claim 41 wherein the gradient of the first component provides the surface with a functional gradient selected from the group consisting of a surface energy gradient, a water absorption gradient, a charge gradient, and combinations thereof.

58. The method of claim 41 wherein the first component is selected from the group consisting of monochlorosilane molecules, dichlorosilane molecules, trichlorosilane molecules, monoalkoxysilane molecules, dialkoxysilane molecules, and trialkoxysilane molecules.

59. The method of claim 41 wherein the step of subjecting the surface to the vapor includes conjugating the first component as a monolayer on the surface.

60. The method of claim 41 wherein the step of subjecting the surface to the vapor includes grafting the first component to the surface.

61. The method of claim 41 wherein the first component is a polymer or a copolymer.

62. The method of claim 41 wherein the step of subjecting the surface to the vapor includes growing the first component on the surface.

63. The method of claim 41 wherein the first component is SH and the surface comprises a metal selected from the group consisting of gold, silver, copper, platinum, palladium, alloys thereof, and combinations thereof.

64. The method of claim 41 wherein the first component comprises a protein molecule.

65. A method for forming a chemically patterned surface, said method comprising:

a) providing a mask on a surface of a substrate to form at least one exposed portion of the surface not covered by the mask and at least one covered portion of the surface covered by the mask; and b) subjecting the surface to a fluid including a component such that the component reacts with the at least one exposed portion and is prevented from reacting with the at least one covered portion by the mask;

c) wherein the component reacted with the at least one exposed portion forms a distribution of the component on the surface, the distribution being a gradient.

66. The method of claim 65 wherein:

a) the at least one exposed portion includes first and second exposed portions;

b) the at least one covered portion is interposed between the first and second exposed portions; and c) the step of subjecting the surface to the fluid includes reacting the component with each of the first and second exposed portions; and d) the gradient of the distribution extends across both of the first and second exposed portions.

67. The method of claim 65 wherein the step of subjecting the substrate to the fluid includes subjecting the substrate to a vapor including the component.

68. The method of claim 65 further including the step of removing the mask from the wafer following the step of subjecting the surface to the fluid.

69. The method of claim 65 wherein the step of providing the mask on the surface of the substrate includes printing the mask on the surface.

70. The method of claim 65 wherein the mask is formed of a polymer or photopolymer.

71. The method of claim 65 wherein, prior to the step of subjecting the surface to the fluid, the surface is modified to create at least one reactive group on the surface capable of reacting with the component of the fluid.

72. The method of claim 71 wherein the reactive group is selected from the group consisting of a hydroxyl group, a carboxyl group, a peroxide group, and combinations thereof.

73. The method of claim 71 wherein the step of modifying the surface includes chemically modifying the surface.

74. The method of claim 65 wherein the substrate comprises a network made of a component selected from the group consisting of natural rubber, synthetic rubber, butadienes, poly(dimethyl siloxane), and combinations thereof.

75. The method of claim 65 wherein the gradient provides the surface with a functional gradient selected from the group consisting of a surface energy gradient, a water absorption gradient, a charge gradient, and combinations thereof.

76. The method of claim 65 wherein the component is selected from the group consisting of monochlorosilane molecules, dichlorosilane molecules, trichlorosilane molecules, monoalkoxysilane molecules, dialkoxysilane molecules, and trialkoxysilane molecules.

77. The method of claim 65 wherein the step of subjecting the surface to the fluid includes conjugating the component as a monolayer on the surface.

78. The method of claim 65 wherein the step of subjecting the surface to the fluid includes grafting the component to the surface.

79. The method of claim 65 wherein the component is a polymer or a copolymer.

80. The method of claim 65 wherein the step of subjecting the surface to the fluid includes growing the component on the surface.

81. The method of claim 65 wherein the component is SH and the surface comprises a metal selected from the group consisting of gold, silver, copper, platinum, palladium, alloys thereof, and combinations thereof.

82. The method of claim 65 wherein the component comprises a protein molecule.

* * * * *